(12) United States Patent
Tanaka et al.

(10) Patent No.: US 6,630,253 B1
(45) Date of Patent: Oct. 7, 2003

(54) ORGANIC ELECTROLUMINESCENCE DEVICE

(75) Inventors: Taizou Tanaka, Tokyo (JP); Satoru Toguchi, Tokyo (JP); Kenji Mori, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/274,963

(22) Filed: Mar. 23, 1999

(30) Foreign Application Priority Data

Mar. 23, 1998 (JP) ............................................ 10-092224

(51) Int. Cl.$^7$ ................................................ H05B 33/14
(52) U.S. Cl. ........................ 428/690; 428/917; 313/504; 313/506
(58) Field of Search ................................ 428/690, 704, 428/917; 313/504, 506

(56) References Cited

U.S. PATENT DOCUMENTS

| 3,673,202 | A | * | 6/1972 | Orlando et al. | |
| 4,769,292 | A | * | 9/1988 | Tang et al. | 428/690 |
| 5,085,946 | A | * | 2/1992 | Saito et al. | 428/690 |
| 5,085,947 | A | * | 2/1992 | Saito et al. | 428/690 |
| 5,281,489 | A | * | 1/1994 | Mori et al. | 428/690 |
| 5,409,783 | A | * | 4/1995 | Tang et al. | 428/690 |

FOREIGN PATENT DOCUMENTS

JP 3-790 A * 1/1991

OTHER PUBLICATIONS

Derwent–Acc–No.: 1986–091302 (for JP 61-37886-A, Feb. 1986).*
Derwent–Acc–No.: 1990–345251 (for JP 2-250292-A, Oct. 1990; and for US 5,085,947, Feb. 1992).*
Derwent–Acc–No.: 1991–018972 (for JP 2-291696-A, Dec. 1990; and for US 5,085,946, Feb. 1992).*
Derwent–Acc–No.: 1991–048183 (for JP 3-790-A, Jan. 1991).*

* cited by examiner

*Primary Examiner*—Marie Yamnitzky
(74) *Attorney, Agent, or Firm*—Young & Thompson

(57) ABSTRACT

A material for the luminescent layer of an organic EL device includes a bis-2,5-(2-benzazolyl) hydroquinone compound represented by a general formula:

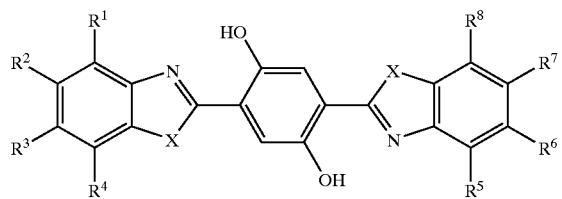

where each of R1–R8 independently represents hydrogen atom, halogen atom, hydroxy group, substituted or unsubstituted amino group, nitro group, cyano group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic complex ring group, substituted or unsubstituted aralkyl group, substituted or unsubstituted aryloxy group, substituted or unsubstituted alkoxy carbonyl group, or carboxyl group, and any two of R1–R8 may form a ring and "X" represents "NH", "O" or "S".

10 Claims, 2 Drawing Sheets

1 : substrate
2 : anode
3 : hole transport layer
4 : luminescent layer
5 : electron transport layer
6 : cathode 1 : substrate
2 : anode
3 : hole transport layer
4 : luminescent layer
5 : electron transport layer
6 : cathode

ORGANIC ELECTROLUMINESCENCE DEVICE

BACKGROUND OF THE INVENTION

1. Field of the Invention

The present invention relates to a red-color luminescent organic electroluminescence device that can be used for a planar light source and a display device.

2. Description of Related Art

Electroluminescence devices are expected to be used for a self-emission type planar display device. Among electroluminescence devices, there are organic electroluminescence devices using an organic substance which will hereinafter be referred to as organic EL devices. These are different from an inorganic electroluminescence device which will hereinafter be referred to as an inorganic EL device in that there is no need for an alternating current driving and a high voltage, and a variety of organic compounds makes it easy to realize multi-color displays, for which reason the organic EL device is expected to be applied to a color display and a development thereof is active.

If the organic EL device is applied to a full color display, it is required to obtain three primary colors, red, green and blue. Many examples of green emission have been reported. For example, a green color device using 8-quinolinol aluminum complex has been reported in *Applied Physics Letters*, vol. 51, p. 193, 1987. A device using a diarylamine derivative is disclosed in Japanese laid-open patent publication No. 8-53397.

Many blue color luminescent devices have been reported. A blue color luminescent device using a stilbene based compound is disclosed in Japanese laid-open patent publication No. 5-295359. A blue color luminescent device using a triarylamine derivative is disclosed in Japanese laid-open patent publication No. 7-53955. A blue color luminescent device using a triarylamine derivative is disclosed in Japanese laid-open patent publication No. 7-53955. A blue color luminescent device using a triaryldiamine derivative is disclosed in Japanese laid-open patent publication No. 8-48656. A blue color luminescent device using a styrylbiphenyl compound is disclosed in Japanese laid-open patent publication No. 6-132080.

In Japanese laid-open patent publication No. 3-152897, it is disclosed that a red color luminescent organic EL device obtains a red-color luminescence by wavelength conversion of the blue color luminescence in a luminescent layer. In Japanese laid-open patent publications Nos. 7-272854, 7-288184, and 8-286033, it is disclosed that a red color fluorescent coloring matter is doped into a luminescent layer to obtain a red-color luminescence.

However, the above red-color luminescent organic EL device is insufficient in both brightness and color purity. In the above-mentioned Japanese laid-open patent publications Nos. 7-272854, 7-288184, and 8-286033, there is disclosed an organic EL device using a red-color fluorescent coloring matter along for a luminescent layer. Notwithstanding, a sufficient color purity for red-color luminescence is not obtained. It is therefore required to further improve the color purity for red-color luminescence.

It is significant that, prior to the present invention, no red-color luminescent organic EL device could be obtained which has sufficiently practicable characteristics or properties.

SUMMARY OF THE INVENTION

The present invention was made in this viewpoint and an object thereof is to provide a red-color luminescent organic EL device having high luminescent brightness and high color purity as well as being stable in use.

An organic electroluminescence device having a cathode, an anode, and at least a single organic thin film including a luminescent layer between the cathode and anode, is characterized in that at least one layer of said organic thin films contains a bis-2,5-(2-benzazoyl) hydroquinone compound represented by a general formula (1):

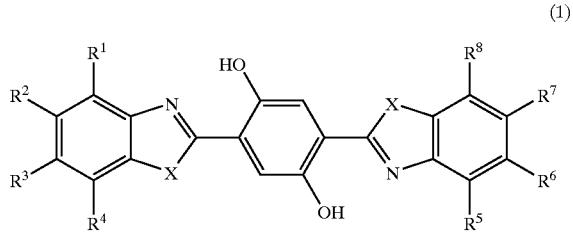

(1)

where each of $R^1$–$R^8$ independently represents hydrogen atom, halogen atom, hydroxyl group, substituted or unsubstituted amino group, nitro group, cyano group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic complex ring group, substituted or unsubstituted aralkyl group, substituted or unsubstituted aryloxy group, substituted or unsubstituted alkoxy carbonyl group, or carboxyl group, and any two of $R^1$–$R^8$ may form a ring and "X" represents "NH", "O" and "S".

It is possible that said luminescent layer comprises a mixture of the bis-2,5-(2-benzazoyl) hydroquinone compound represented by the general formula (1) and an aromatic amine compound represented by a general formula (2):

(2)

where each of $Ar^1$–$Ar^3$ independently represents substituted or unsubstituted aromatic hydrocarbon group, or substituted or unsubstituted aromatic complex ring group, and any two of substituents possessed by $Ar^1$–$Ar^3$ may form a ring.

It is also possible that said luminescent layer comprises a mixture of the bis-2,5-(2-benzazoyl) hydroquinone compound represented by the general formula (1) and an aromatic diamine compound represented by a general formula (3):

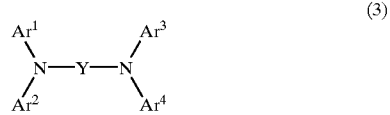

(3)

where each of $Ar^1$–$Ar^4$ independently represents substituted or unsubstituted aromatic hydrocarbon group, or substituted or unsubstituted aromatic complex ring group, and "Y" represents substituted or unsubstituted arylene group, any two of substituents possessed by $Ar^1$–$Ar^4$ may form a ring.

It is also possible that said luminescent layer comprises a mixture of the bis-2,5-(2-benzazoyl) hydroquinone compound represented by the general formula (1) and an aromatic triamine compound represented by a general formula (4):

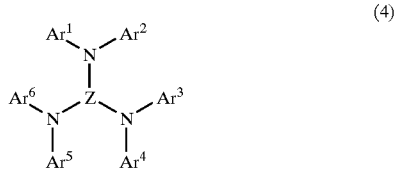

(4)

where each of $Ar^1$–$Ar^6$ independently represents substituted or unsubstituted aromatic hydrocarbon group, or substituted or unsubstituted aromatic complex ring group, and "Z" represents trivalent substituted or substituted aromatic hydrocarbon group or substituted or unsubstituted aromatic complex ring group, any two of substituents possessed by $Ar^1$–$Ar^6$ may form a ring.

It is also possible that said luminescent layer comprises a mixture of the bis-2,5-(2-benzazoyl) hydroquinone compound represented by the general formula (1) and an oxime metal complex compound represented by general formula (5):

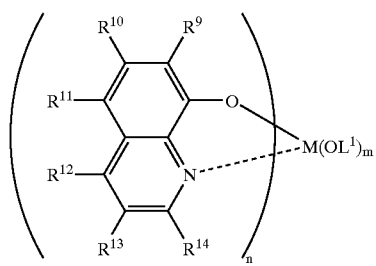

(5)

where each of $R^9$–$R^{14}$ independently represents hydrogen atom, halogen atom, hydroxyl group, substituted or unsubstituted amino group, nitro group, cyano group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic complex ring group, substituted or unsubstituted aralkyl group, substituted or unsubstituted aryloxy group, substituted or unsubstituted alkoxy carbonyl group, or carboxyl group, any two of substituents possessed by $R^9$–$R^{14}$ may form a ring, and "L1" represents substituted or unsubstituted alkyl group, substituted or unsubstituted alkenyl group, substituted or unsubstituted cycloalkyl group, substituted or unsubstituted aromatic hydrocarbon group, substituted or unsubstituted aromatic complex ring group, or substituted or unsubstituted aralkyl group, and "n" is the integer in the range of 1–3, and "m" is the integer in the range of 0–2, and "M" represents a metal ion of (n+m)-valence.

It is also possible that said luminescent layer comprises a mixture of the bis-2,5-(2-benzazoyl) hydroquinone compound represented by the general formula (1) and an oxime metal complex compound represented by a general formula (6):

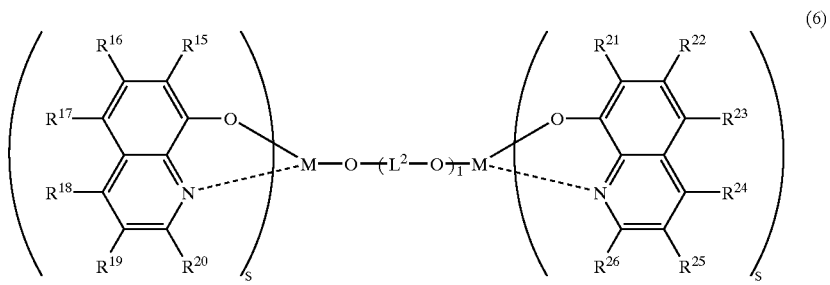

(6)

where each of $R^{15}$–$R^{26}$ independently represents hydrogen atom, halogen atom, hydroxyl group, substituted or unsubstituted amino group, nitro group, cyano group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic complex ring group, substituted or unsubstituted aralkyl group, substituted or unsubstituted aryloxy group, substituted or unsubstituted alkoxy carbonyl group, or carboxyl group, any two of substituents possessed by $R^{15}$–$R^{26}$ may form a ring, and "L2" represents substituted or unsubstituted alkylene group, substituted or unsubstituted alkenylene group, substituted or unsubstituted cycloalkylene group, substituted or unsubstituted arylene group, or substituted or unsubstituted aralkylene group, and "1" is the integer of 0 or 1, and "s" is the integer of 1 or 2, and "M" represents a metal ion of (s+1)-valence.

It is also possible that said cathode, said luminescent layer and said anode are sequentially provided, in descending order, over a predetermined substrate.

It is also possible that said cathode, an electron transfer layer, said luminescent layer, a hole transfer layer and said anode are sequentially provided, in descending order, over a predetermined substrate.

It is also possible that said cathode, an electron transfer layer, said luminescent layer and said anode are sequentially provided, in descending order, over a predetermined substrate.

It is also possible that said cathode, said luminescent layer, a hole transfer layer and said anode are sequentially provided, in descending order, over a predetermined substrate.

An organic electroluminescence device in accordance with the present invention has a cathode, an anode, and at least a single organic thin film including a luminescent layer between those cathode and anode, wherein at least one layer of said organic thin films contains a bis-2,5-(2-benzazoyl) hydroquinone compound represented by the general formula (1).

The organic EL device in accordance with the present invention will hereinafter be described, but prior to this, processes for achieving the present invention will be described. The present inventors conducted extensive experiments and research to find the structure of a red-color organic EL device having superior high luminescent brightness and color purity as well as high stability in use. As a result, it could be found that a specified bis-2,5-(2-benzazoyl) hydroquinone compound is used for the organic EL device to obtain the red-color luminescent organic EL device which satisfies those requirements, whereby the present invention was achieved. It could also be found that if the above bis-2,5-(2-benzazoyl) hydroquinone compound is used in combination with an aromatic amine compound, an aromatic diamine compound or an aromatic triamine compound having a specific aromatic hydrocarbon or an aromatic complex ring as a substituent, then the red-color luminescent organic EL device with particularly superior characteristics is obtainable, whereby the present invention was achieved. It could also be found that if the above compound is used in combination with a specific oxime metal complex material, then the red-color luminescent organic EL device with particularly superior characteristics is obtainable, whereby the present invention was achieved.

DESCRIPTION OF PREFERRED CHEMICAL SPECIES

The bis-2,5-(2-benzazoyl) hydroquinone compound used for the organic EL device in accordance with the present invention is a compound represented by a general formula (1). In the general formula (1), each of $R^1$–$R^8$ independently represents hydrogen atom, halogen atom, hydroxyl group, substituted or unsubstituted amino group, nitro group, cyano group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic complex ring group, substituted or unsubstituted aralkyl group, substituted or unsubstituted aryloxy group, substituted or unsubstituted alkoxy carbonyl group, or carboxyl group, and any two of $R^1$–$R^8$ may form a ring and "X" represents "NH", "O" and "S".

The aromatic amine compound, the aromatic diamine compound and the aromatic triamine compound compounds have structures represented by the general formulae (2), (3) and (4). In the general formulae (2), (3) and (4), each of $Ar^1$–$Ar^6$ independently represents substituted or unsubstituted aromatic hydrocarbon group, or substituted or unsubstituted aromatic complex ring group. "Y" represents substituted or unsubstituted arylene group. "Z" represents trivalent substituted or unsubstituted aromatic hydrocarbon group or substituted or unsubstituted aromatic complex ring group.

The oxime metal complex material used for the organic EL device in accordance with the present invention is a compound having a structure represented by the general formulae (5) and (6). In the general formulae (5) and (6), each of $R^9$–$R^{26}$ independently represents hydrogen atom, halogen atom, hydroxyl group, substituted or unsubstituted amino group, nitro group, cyano group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic complex ring group, substituted or unsubstituted aralkyl group, substituted or unsubstituted aryloxy group, substituted or unsubstituted alkoxy carbonyl group, or carboxyl group. "L1" represents substituted or unsubstituted alkyl group, substituted or unsubstituted alkenyl group, substituted or unsubstituted cycloalkyl group, substituted or unsubstituted aromatic hydrocarbon group, substituted or unsubstituted aromatic complex ring group, or substituted or unsubstituted aralkyl group. "L2" represents substituted or unsubstituted alkylene group, substituted or unsubstituted alkenylene group, substituted or unsubstituted cycloalkylene group, substituted or unsubstituted arylene group, or substituted or unsubstituted aralkylene group. "n" is the integer in the range of 1–3. "m" is the integer in the range of 0–2. "1" is the integer of 0 or 1. "s" is the integer of 1 or 2. and "M" represents a metal ion of (n+m)-valence or (s+1)-valence.

Available halogen atoms are fluorine, chlorine, and iodine. Substituted or unsubstituted amino group represents —NX1 X2. As X1 and X2, there are available hydrogen atom, methyl groups, ethyl groups, propyl groups, isopropyl groups, n-butyl groups, s-butyl groups, isobutyl groups, t-butyl groups, n-pentyl groups, n-hexyl groups, n-heptyl groups, n-octyl groups, hydroxymethyl groups, 1-hydroxyethyl groups, 2-hydroxyethyl groups, 2-hydroxyisobutyl groups, 1,2-dihydroxyethyl groups, 1,3-dihydroxyisopropyl groups, 2,3-dihydroxy-t-butyl groups, 1,2,3-trihydroxypropyl groups, chloromethyl groups, 1-chloroethyl groups, 2-chloroethyl groups, 2-chloroisobutyl groups, 1,2-dichloroethyl groups, 1,3-dichloroisopropyl groups, 2,3-dichloro-t-butyl groups, 1,2,3-trichloropropyl groups, bromomethyl groups, 1-bromoethyl groups, 2-bromoethyl groups, 2-bromoisobutyl groups, 1,2-dibromoethyl groups, 1,3-dibromoisopropyl groups, 2,3-dibromo-t-butyl groups, 1,2,3-tribromopropyl groups, iodomethyl groups, 1-iodoethyl groups, 2-iodoethyl groups, 2-iodoisobutyl groups, 1,2-diiodoethyl groups, 1,3-diiodoisopropyl groups, 2,3-diiodo-t-butyl groups, 1,2,3-triiodopropyl groups, aminomethyl groups, 1-aminoethyl groups, 2-aminoethyl groups, 2-aminoisobutyl groups, 1,2-diaminoethyl groups, 1,3-diaminoisopropyl groups, 2,3-diamino-t-butyl groups, 1,2,3-triaminopropyl groups, cyanomethyl groups, 1-cyanoethyl groups, 2-cyanoethyl groups, 2-cyanoisobutyl groups, 1,2-dicyanoethyl groups, 1,3-dicyanoisopropyl groups, 2,3-dicyano-t-butyl groups, 1,2,3-tricyanopropyl groups, nitromethyl groups, 1-nitroethyl groups, 2-nitroethyl groups, 2-nitroisobutyl groups, 1,2-dinitroethyl groups, 1,3-dinitroisopropyl groups, 2,3-dinitro-t-butyl groups, 1,2,3-trinitropropyl groups, phenyl groups, 1-naphthyl groups, 2-naphthyl groups, 1-anthryl groups, 2-anthryl groups, 9-anthryl groups, 1-phenanthryl groups, 2-phenanthryl groups, 3-phenanthryl groups, 4-phenanthryl groups, 9-phenanthryl groups, 1-naphthacenyl groups, 2-naphthacenyl groups, 9-naphthacenyl groups, 4-styrylphenyl groups, 1-pyrenyl groups, 2-pyrenyl groups, 4-pyrenyl groups, 2-biphenylyl groups, 3-biphenylyl groups, 4-biphenylyl groups, p-terphenyl-4-yl groups, p-terphenyl-3-yl groups, p-terphenyl-2-yl groups, m-terphenyl-4-yl groups, m-terphenyl-3-yl groups, m-terphenyl-2-yl groups, o-tryl groups, m-tryl groups, p-tryl groups, p-t-butylphenyl groups, p-(2-phenylpropyl)phenyl groups, 3-methyl-2-naphthyl groups, 4-methyl-1-naphthyl groups, 4-methyl-1-anthryl groups, 4'-methylbiphenylyl groups, 4"-t-butyl-p-terphenyl-4-yl groups, 2-pyroryl groups, 3-pyroryl groups, pyradinyl groups, 2-pyridinyl groups, 3-pyridinyl groups, 4-pyridinyl groups, 2-indolyl groups, 3-indolyl groups, 4-indolyl groups, 5-indolyl groups, 6-indolyl groups, 7-indolyl groups, 1-isoindolyl groups, 3-isoindolyl groups, 4-isoindolyl groups, 5-isoindolyl groups, 6-isoindolyl groups, 7-isoindolyl groups, 2-furyl groups, 3-furyl groups, 2-benzoflanyl groups, 3-benzoflanyl groups, 4-benzoflanyl groups, 5-benzoflanyl groups, 6-benzoflanyl groups, 7-benzoflanyl groups, 1-isobenzoflanyl groups, 3-isobenzoflanyl groups, 4-isobenzoflanyl groups, 5-isobenzoflanyl groups, 6-isobenzoflanyl groups, 7-isobenzoflanyl groups, 2-quinolyl groups, 3-quinolyl groups, 4-quinolyl groups, 5-quinolyl groups, 6-quinolyl groups, 7-quinolyl groups, 8-quinolyl groups, 1-isoquinolyl groups, 3-isoquinolyl groups, 4-isoquinolyl groups, 5-isoquinolyl groups, 6-isoquinolyl groups, 7-isoquinolyl groups, 8-isoquinolyl groups, 2-quinoxalinyl, 5-quinoxalinyl, 6-quinoxalinyl, 1-carbazolyl groups, 2-carbazolyl groups, 3-carbazolyl groups, 4-carbazolyl groups, 1-phenanthridinyl groups, 2-phenanthridinyl groups, 3-phenanthridinyl groups, 4-phenanthridinyl groups, 6-phenanthridinyl groups, 7-phenanthridinyl groups, 8-phenanthridinyl groups, 9-phenanthridinyl groups, 10-phenanthridinyl groups, 1-acridinyl groups, 2-acridinyl groups, 3-acridinyl groups, 4-acridinyl groups, 9-acridinyl groups, 1,7-phenanthroline-2-yl groups, 1,7-phenanthroline-3-yl groups, 1,7-phenanthroline-4-yl groups, 1,7-phenanthroline-5-yl groups, 1,7-phenanthroline-6-yl groups, 1,7-phenanthroline-8-yl groups, 1,7-phenanthroline-9-yl groups, 1,7-phenanthroline-10-yl groups, 1,8-phenanthroline-2-yl groups, 1,8-phenanthroline-3-yl groups, 1,8-phenanthroline-4-yl groups, 1,8-phenanthroline-5-yl groups, 1,8-phenanthroline-6-yl groups, 1,8-phenanthroline-7-yl groups, 1,8-phenanthroline-9-yl groups, 1,8-phenanthroline-10-yl groups, 1,9-phenanthroline-2-yl groups, 1,9-phenanthroline-3-yl groups, 1,9-phenanthroline-4-yl groups, 1,9-phenanthroline-5-yl groups, 1,9-phenanthroline-6-yl groups, 1,9-phenanthroline-7-yl groups, 1,9-phenanthroline-8-yl groups, 1,9-phenanthroline-10-yl groups, 1,10-phenanthroline-2-yl groups, 1,10-phenanthroline-3-yl groups, 1,10-phenanthroline-4-yl groups, 1,10-phenanthroline-3-yl groups, 2,9-phenanthroline-1-yl groups, 2,9-phenanthroline-3-yl groups, 2,9-phenanthroline-4-yl groups, 2,9-phenanthroline-3-yl groups, 2,9-phenanthroline-6-yl groups, 2,9-phenanthroline-7-yl groups, 2,9-phenanthroline-8-yl groups, 2,9-phenanthroline-10-yl groups, 2,8-phenanthroline-1-yl groups, 2,8-phenanthroline-3-yl groups, 2,8-phenanthroline-4-yl groups, 2,8-phenanthroline-5-yl groups, 2,8-phenanthroline-6-yl groups, 2,8-phenanthroline-7-yl groups, 2,8-phenanthroline-9-yl groups, 2,8-phenanthroline-10-yl groups, 2,7-phenanthroline-1-yl groups, 2,7-phenanthroline-3-yl groups, 2,7-phenanthroline-4-yl groups, 2,7-phenanthroline-5-yl groups, 2,7-phenanthroline-6-yl groups, 2,7-phenanthroline-8-yl groups, 2,7-phenanthroline-9-yl groups, 2,7-phenanthroline-10-yl groups, 1-phenadinyl groups, 1-phonotiadinyl groups, 2-phonotiadinyl groups, 3-phonotiadinyl groups, 4-phonotiadinyl groups, 1-phonoxadinyl groups, 2-phonoxadinyl groups, 3-phonoxadinyl groups, 4-phonoxadinyl groups, 2-oxazolyl groups, 4-oxazolyl groups, 5-oxazolyl groups, 2-oxadiazolyl groups, 5-oxadiazolyl groups, 3-frazanyl groups, 2-thienyl groups, 3-thienyl groups, 2-methylpyrrole-1-yl groups, 2-methylpyrrole-3-yl groups, 2-methylpyrrole-4-yl groups, 2-methylpyrrole-5-yl groups, 3-methylpyrrole-1-yl groups, 3-methylpyrrole-2-yl groups, 3-methylpyrrole-4-yl groups, 3-methylpyrrole-5-yl groups, 2-t-butylpyrrole-4-yl groups, 3-(2-phenylpropyl)pyrrole-1-yl groups, 2-methyl-1-indolyl groups, 4-methyl-1-indolyl groups, 2-methyl-3-indolyl groups, 4-methyl-3-indolyl groups, 2-t-butyl-1-indolyl groups, 4-t-butyl-1-indolyl groups, 2-t-butyl-3-indolyl groups, and 4-t-butyl-3-indolyl groups, and the like.

Available substituted or unsubstituted alkyl groups are methyl groups, ethyl groups, propyl groups, isopropyl groups, n-butyl groups, s-butyl groups, isobutyl groups, t-butyl groups, n-pentyl groups, n-hexyl groups, n-heptyl groups, n-octyl groups, hydroxymethyl groups, 1-hydroxyethyl groups, 2-hydroxyethyl groups, 2-hydroxyisobutyl groups, 1,2-dihydroxyethyl groups, 1,3-dihydroxyisopropyl groups, 2,3-dihydroxy-t-butyl groups, 1,2,3-trihydroxypropyl groups, chloromethyl groups, 1-chloroethyl groups, 2-chloroethyl groups, 2-chloroisobutyl groups, 1,2-dichloroethyl groups, 1,3-dichloroisopropyl groups, 2,3-dichloro-t-butyl groups, 1,2,3-trichloropropyl groups, bromomethyl groups, 1-bromoethyl groups, 2-bromoethyl groups, 2-bromoisobutyl groups, 1,2-dibromoethyl groups, 1,3-dibromoisopropyl groups, 2,3-dibromo-t-butyl groups, 1,2,3-tribromopropyl groups, iodomethyl groups, 1-iodoethyl groups, 2-iodoethyl groups, 2-iodoisobutyl groups, 1,2-diiodoethyl groups, 1,3-diiodoisopropyl groups, 2,3-diiodo-t-butyl groups, 1,2,3-triiodopropyl groups, aminomethyl groups, 1-aminoethyl groups, 2-aminoethyl groups, 2-aminoisobutyl groups, 1,2-diaminoethyl groups, 1,3-diaminoisopropyl groups, 2,3-diamino-t-butyl groups, 1,2,3-triaminopropyl groups, cyanomethyl groups, 1-cyanoethyl groups, 2-cyanoethyl groups, 2-cyanoisobutyl groups, 1,2-dicyanoethyl groups, 1,3-dicyanoisopropyl groups, 2,3-dicyano-t-butyl groups, 1,2,3-tricyanopropyl groups, nitromethyl groups, 1-nitroethyl groups, 2-nitroethyl groups, 2-nitroisobutyl groups, 1,2-dinitroethyl groups, 1,3-dinitroisopropyl groups, 2,3-dinitro-t-butyl groups, 1,2,3-trinitropropyl groups, and the like.

Available substituted or unsubstituted alkenyl groups are vinyl groups, allyl groups, 2-butenyl groups, 3-butenyl groups, 1,3-butanedienyl groups, 1-methylvinyl groups, styryl groups, 2,2-diphenylvinyl groups, 1,2-diphenylvinyl groups, 1-methylallyl groups, 1,1-dimethylallyl groups, 2-methylallyl groups, 1-phenylallyl groups, 2-phenylallyl groups, 3-phenylallyl groups, 3,3-diphenylallyl groups, 1,2-dimethylallyl groups, 1-phenyl-1-butenyl groups, 3-phenyl-1-butenyl groups and the like.

Available substituted or unsubstituted cycloalkyl groups are cyclopropyl groups, cyclobutyl groups, cyclopentyl groups, cyclohexyl groups, 4-methylcyclohexyl groups, and the like.

Available substituted or unsubstituted alkoxy groups are groups represented by —OY1 and "Y1" may be methyl groups, ethyl groups, propyl groups, isopropyl groups, n-butyl groups, s-butyl groups, isobutyl groups, t-butyl groups, n-pentyl groups, n-hexyl groups, n-heptyl groups, n-octyl groups, hydroxymethyl groups, 1-hydroxyethyl groups, 2-hydroxyethyl groups, 2-hydroxyisobutyl groups, 1,2-dihydroxyethyl groups, 1,3-dihydroxyisopropyl groups, 2,3-dihydroxy-t-butyl groups, 1,2,3-trihydroxypropyl groups, chloromethyl groups, 1-chloroethyl groups, 2-chloroethyl groups, 2-chloroisobutyl groups, 1,2-dichloroethyl groups, 1,3-dichloroisopropyl groups, 2,3-dichloro-t-butyl groups, 1,2,3-trichloropropyl groups, bromomethyl groups, 1-bromoethyl groups, 2-bromoethyl groups, 2-bromoisobutyl groups, 1,2-dibromoethyl groups, 1,3-dibromoisopropyl groups, 2,3-dibromo-t-butyl groups, 1,2,3-tribromopropyl groups, iodomethyl groups, 1-iodoethyl groups, 2-iodoethyl groups, 2-iodoisobutyl groups, 1,2-diiodoethyl groups, 1,3-diiodoisopropyl groups, 2,3-diiodo-t-butyl groups, 1,2,3-triiodopropyl groups, aminomethyl groups, 1-aminoethyl groups, 2-aminoethyl groups, 2-aminoisobutyl groups, 1,2-diaminoethyl groups, 1,3-diaminoisopropyl groups, 2,3-diamino-t-butyl groups, 1,2,3-triaminopropyl groups, cyanomethyl groups, 1-cyanoethyl groups, 2-cyanoethyl groups, 2-cyanoisobutyl groups, 1,2-dicyanoethyl groups, 1,3-dicyanoisopropyl groups, 2,3-dicyano-t-butyl groups, 1,2,3-tricyanopropyl groups, nitromethyl groups, 1-nitroethyl groups, 2-nitroethyl groups, 2-nitroisobutyl groups, 1,2-dinitroethyl groups, 1,3-dinitroisopropyl groups, 2,3-dinitro-t-butyl groups, 1,2,3-trinitropropyl groups, and the like.

Available substituted or unsubstituted aromatic hydrocarbon groups are phenyl groups, 1-naphthyl groups, 2-naphthyl groups, 1-anthryl groups, 2-anthryl groups, 9-anthryl groups, 1-phenanthryl groups, 2-phenanthryl groups, 3-phenanthryl groups, 4-phenanthryl groups, 9-phenanthryl groups, 1-naphthacenyl groups, 2-naphthacenyl groups, 9-naphthacenyl groups, 1-pyrenyl groups, 2-pyrenyl groups, 4-pyrenyl groups, 2-biphenylyl groups, 3-biphenylyl groups, 4-biphenylyl groups, p-terphenyl-4-yl groups, p-terphenyl-3-yl groups, p-terphenyl-2-yl groups, m-terphenyl-4-yl groups, m-terphenyl-3-yl groups, m-terphenyl-2-yl groups, o-tryl groups, m-tryl groups, p-tryl groups, p-t-butylphenyl groups, p-(2-phenylpropyl)phenyl groups, 3-methyl-2-naphthyl groups, 4-methyl-1-naphthyl groups, 4-methyl-1-anthryl groups, 4'-methylbiphenylyl groups, 4"-t-butyl-p-terphenyl-4-yl groups, and the like.

Available substituted or unsubstituted aromatic hydrocarbon groups are 1-pyroryl groups, 2-pyroryl groups, 3-pyroryl groups, pyradinyl groups, 2-pyridinyl groups, 3-pyridinyl groups, 4-pyridinyl groups, 1-indolyl groups, 2-indolyl groups, 3-indolyl groups, 4-indolyl groups, 5-indolyl groups, 6-indolyl groups, 7-indolyl groups, 1-isoindolyl groups, 2-isoindolyl groups, 3-isoindolyl groups, 4-isoindolyl groups, 5-isoindolyl groups, 6-isoindolyl groups, 7-isoindolyl groups, 2-furyl groups, 3-furyl groups, 2-benzoflanyl groups, 3-benzoflanyl groups, 4-benzoflanyl groups, 5-benzoflanyl groups, 6-benzoflanyl groups, 7-benzoflanyl groups, 1-isobenzoflanyl groups, 3-isobenzoflanyl groups, 4-isobenzoflanyl groups, 5-isobenzoflanyl groups, 6-isobenzoflanyl groups, 7-isobenzoflanyl groups, 2-quinolyl groups, 3-quinolyl groups, 4-quinolyl groups, 5-quinolyl groups, 6-quinolyl groups, 7-quinolyl groups, 8-quinolyl groups, 1-isoquinolyl groups, 3-isoquinolyl groups, 4-isoquinolyl groups, 5-isoquinolyl groups, 6-isoquinolyl groups, 7-isoquinolyl groups, 8-isoquinolyl groups, 2-quinoxalinyl, 5-quinoxalinyl, 6-quinoxalinyl, 1-carbazolyl groups, 2-carbazolyl groups, 3-carbazolyl groups, 4-carbazolyl groups, 9-carbazolyl groups, 1-phenanthridinyl groups, 2-phenanthridinyl groups, 3-phenanthridinyl groups, 4-phenanthridinyl groups, 6-phenanthridinyl groups, 7-phenanthridinyl groups, 8-phenanthridinyl groups, 9-phenanthridinyl groups, 10-phenanthridinyl groups, 1-acridinyl groups, 2-acridinyl groups, 3-acridinyl groups, 4-acridinyl groups, 9-acridinyl groups, 1,7-phenanthroline-2-yl groups, 1,7-phenanthroline-3-yl groups, 1,7-phenanthroline-4-yl groups, 1,7-phenanthroline-5-yl groups, 1,7-phenanthroline-6-yl groups, 1,7-phenanthroline-8-yl groups, 1,7-phenanthroline-9-yl groups, 1,7-phenanthroline-10-yl groups, 1,8-phenanthroline-2-yl groups, 1,8-phenanthroline-3-yl groups, 1,8-phenanthroline-4-yl groups, 1,8-phenanthroline-5-yl groups, 1,8-phenanthroline-6-yl groups, 1,8-phenanthroline-7-yl groups, 1,8-phenanthroline-9-yl groups, 1,8-phenanthroline-10-yl groups, 1,9-phenanthroline-2-yl groups, 1,9-phenanthroline-3-yl groups, 1,9-phenanthroline-4-yl groups, 1,9-phenanthroline-5-yl groups, 1,9-phenanthroline-6-yl groups, 1,9-phenanthroline-7-yl groups, 1,9-phenanthroline-8-yl groups, 1,9-phenanthroline-10-yl groups, 1,10-phenanthroline-2-yl groups, 1,10-phenanthroline-3-yl groups, 1,10-phenanthroline-4-yl groups, 1,10-phenanthroline-5-yl groups, 2,9-phenanthroline-1-yl groups, 2,9-phenanthroline-3-yl groups, 2,9-phenanthroline-4-yl groups, 2,9-phenanthroline-5-yl groups, 2,9-phenanthroline-6-yl groups, 2,9-phenanthroline-7-yl groups, 2,9-phenanthroline-8-yl groups, 2,9-phenanthroline-10-yl groups, 2,8-phenanthroline-1-yl groups, 2,8-phenanthroline-3-yl groups, 2,8-phenanthroline-4-yl groups, 2,8-phenanthroline-5-yl groups, 2,8-phenanthroline-6-yl groups, 2,8-phenanthroline-7-yl groups, 2,8-phenanthroline-9-yl groups, 2,8-phenanthroline-10-yl groups, 2,7-phenanthroline-1-yl groups, 2,7-phenanthroline-3-yl groups, 2,7-phenanthroline-4-yl groups, 2,7-phenanthroline-5-yl groups, 2,7-phenanthroline-6-yl groups, 2,7-phenanthroline-8-yl groups, 2,7-phenanthroline-9-yl groups, 2,7-phenanthroline-10-yl groups, 1-phenadinyl groups, 2-phenadinyl groups, 1-phonotiadinyl groups, 2-phonotiadinyl groups, 3-phonotiadinyl groups, 4-phonotiadinyl groups, 10-phonotiadinyl groups, 1-phonoxadinyl groups, 2-phonoxadinyl groups, 3-phonoxadinyl groups, 4-phonoxadinyl groups, 10-phonoxadinyl groups, 2-oxazolyl groups, 4-oxazolyl groups, 5-oxazolyl groups, 2-oxadiazolyl groups, 5-oxadiazolyl groups, 3-frazanyl groups, 2-thienyl groups, 3-thienyl groups, 2-methylpyrrole-1-yl groups, 2-methylpyrrole-3-yl groups, 2-methylpyrrole-4-yl groups, 2-methylpyrrole-5-yl groups, 3-methylpyrrole-1-yl groups, 3-methylpyrrole-2-yl groups, 3-methylpyrrole-4-yl groups, 3-methylpyrrole-5-yl groups, 2-t-butylpyrrole-4-yl groups, 3-(2-phenylpropyl)pyrrole-1-yl groups, 2-methyl-1-indolyl groups, 4-methyl-1-indolyl groups, 2-methyl-3-indolyl groups, 4-methyl-3-indolyl groups, 2-t-butyl-1-indolyl groups, 4-t-butyl-1-indolyl groups, 2-t-butyl-3-indolyl groups, and 4-t-butyl-3-indolyl groups, and the like.

Available substituted or unsubstituted aralkyl groups are benzyl groups, 1-phenylethyl groups, 2-phenylethyl groups, 1-phenylisopropyl groups, 2-phenylisopropyl groups, phenyl-t-butyl groups, α-naphthylmethyl groups, 1-α-naphthylethyl groups, 2-α-naphthylethyl groups, 1-α-naphthylisopropyl groups, 2-α-naphthylisopropyl groups, β-naphthylmethyl groups, 1-β-naphthylethyl groups, 2-β-naphthylethyl groups, 1-β-naphthylisopropyl groups, 2-β-naphthyl isopropyl groups, 1-pyrrolylmethyl groups, 2-(1-pyrrolyl)ethyl groups, p-methylbenzyl groups, m-methylbenzyl groups, o-methylbenzyl groups, p-chlorobenzyl groups, m-chlorobenzyl groups, o-chlorobenzyl groups, p-bromobenzyl groups, m-bromobenzyl groups, o-bromobenzyl groups, p-iodobenzyl groups, m-iodobenzyl groups, o-iodobenzyl groups, p-hydroxybenzyl groups, m-hydroxybenzyl groups, o-hydroxybenzyl groups, p-aminobenzyl groups, m-aminobenzyl groups, o-aminobenzyl groups, p-nitrobenzyl groups, m-nitrobenzyl groups, o-nitrobenzyl groups, p-cyanobenzyl groups, m-cyanobenzyl groups, o-cyanobenzyl groups, 1-hydroxy-2-phenylisopropyl groups, 1-chloro-2-phenylisopropyl groups, and the like.

Available substituted or unsubstituted aryloxy groups are represented by —OZ1 and "Z1" may be phenyl groups, 1-naphthyl groups, 2-naphthyl groups, 1-anthryl groups, 2-anthryl groups, 9-anthryl groups, 1-phenanthryl groups, 2-phenanthryl groups, 3-phenanthryl groups, 4-phenanthryl groups, 9-phenanthryl groups, 1-naphthacenyl groups, 2-naphthacenyl groups, 9-naphthacenyl groups, 1-pyrenyl groups, 2-pyrenyl groups, 4-pyrenyl groups, 2-biphenylyl groups, 3-biphenylyl groups, 4-biphenylyl groups, p-terphenyl-4-yl groups, p-terphenyl-3-yl groups, p-terphenyl-2-yl groups, m-terphenyl-4-yl groups, m-terphenyl-3-yl groups, m-terphenyl-2-yl groups, o-tryl groups, m-tryl groups, p-tryl groups, p-t-butylphenyl groups, p-(2-phenylpropyl)phenyl groups, 3-methyl-2-naphthyl groups, 4-methyl-1-naphthyl groups, 4-methyl-1-anthryl groups, 4'-methylbiphenylyl groups, 4"-t-butyl-p-terphenyl-4-yl groups, 2-pyroryl groups, 3-pyroryl groups, pyradinyl groups, 2-pyridinyl groups, 3-pyridinyl groups, 4-pyridinyl groups, 1-indolyl groups, 2-indolyl groups, 3-indolyl groups, 4-indolyl groups, 5-indolyl groups, 6-indolyl groups, 7-indolyl groups, 1-isoindolyl groups, 3-isoindolyl groups, 4-isoindolyl groups, 5-isoindolyl groups, 6-isoindolyl groups, 7-isoindolyl groups, 2-furyl groups, 3-furyl groups, 2-benzoflanyl groups, 3-benzoflanyl groups, 4-benzoflanyl groups, 5-benzoflanyl groups, 6-benzoflanyl groups, 7-benzoflanyl groups, 1-isobenzoflanyl groups, 3-isobenzoflanyl groups, 4-isobenzoflanyl groups, 5-isobenzoflanyl groups, 6-isobenzoflanyl groups, 7-isobenzoflanyl groups, 2-quinolyl groups, 3-quinolyl groups, 4-quinolyl groups, 5-quinolyl groups, 6-quinolyl groups, 7-quinolyl groups, 8-quinolyl groups, 1-isoquinolyl groups, 3-isoquinolyl groups, 4-isoquinolyl groups, 5-isoquinolyl groups, 6-isoquinolyl groups, 7-isoquinolyl groups, 8-isoquinolyl groups, 2-quinoxalinyl, 5-quinoxalinyl, 6-quinoxalinyl, 1-carbazolyl groups, 2-carbazolyl groups, 3-carbazolyl groups, 4-carbazolyl groups, 1-phenanthridinyl groups, 2-phenanthridinyl groups, 3-phenanthridinyl groups, 4-phenanthridinyl groups, 6-phenanthridinyl groups, 7-phenanthridinyl groups, 8-phenanthridinyl groups, 9-phenanthridinyl groups, 10-phenanthridinyl groups, 1-acridinyl groups, 2-acridinyl groups, 3-acridinyl groups, 4-acridinyl groups, 9-acridinyl groups, 1,7-phenanthroline-2-yl groups, 1,7-phenanthroline-3-yl groups, 1,7-phenanthroline-4-yl groups, 1,7-phenanthroline-5-yl groups, 1,7-phenanthroline-6-yl groups, 1,7-phenanthroline-8-yl groups, 1,7-phenanthroline-9-yl groups, 1,7-phenanthroline-10-yl groups, 1,8-phenanthroline-2-yl groups, 1,8-phenanthroline-3-yl groups, 1,8-phenanthroline-4-yl groups, 1,8-phenanthroline-5-yl groups, 1,8-phenanthroline-6-yl groups, 1,8-phenanthroline-7-yl groups, 1,8-phenanthroline-9-yl groups, 1,8-phenanthroline-10-yl groups, 1,9-phenanthroline-2-yl groups, 1,9-phenanthroline-3-yl groups, 1,9-phenanthroline-4-yl groups, 1,9-phenanthroline-5-yl groups, 1,9-phenanthroline-6-yl groups, 1,9-phenanthroline-7-yl groups, 1,9-phenanthroline-8-yl groups, 1,9-phenanthroline-10-yl groups, 1,10-phenanthroline-2-yl groups, 1,10-phenanthroline-3-yl groups, 1,10-phenanthroline-4-yl groups, 1,10-phenanthroline-5-yl groups, 2,9-phenanthroline-1-yl groups, 2,9-phenanthroline-3-yl groups, 2,9-phenanthroline-4-yl groups, 2,9-phenanthroline-5-yl groups, 2,9-phenanthroline-6-yl groups, 2,9-phenanthroline-7-yl groups, 2,9-phenanthroline-8-yl groups, 2,9-phenanthroline-10-yl groups, 2,8-phenanthroline-1-yl groups, 2,8-phenanthroline-3-yl groups, 2,8-phenanthroline-4-yl groups, 2,8-phenanthroline-5-yl groups, 2,8-phenanthroline-6-yl groups, 2,8-phenanthroline-7-yl groups, 2,8-phenanthroline-9-yl groups, 2,8-phenanthroline-10-yl groups, 2,7-phenanthroline-1-yl groups, 2,7-phenanthroline-3-yl groups, 2,7-phenanthroline-4-yl groups, 2,7-phenanthroline-5-yl groups, 2,7-phenanthroline-6-yl groups, 2,7-phenanthroline-8-yl groups, 2,7-phenanthroline-9-yl groups, 2,7-phenanthroline-10-yl groups, 1-phenadinyl groups, 2-phenadinyl groups, 1-phonotiadinyl groups, 2-phonotiadinyl groups, 3-phonotiadinyl groups, 4-phonotiadinyl groups, 1-phonoxadinyl groups, 2-phonoxadinyl groups, 3-phonoxadinyl groups, 4-phonoxadinyl groups, 2-oxazolyl groups, 4-oxazolyl groups, 5-oxazolyl groups, 2-oxadiazolyl groups, 5-oxadiazolyl groups, 3-frazanyl groups, 2-thienyl groups, 3-thienyl groups, 2-methylpyrrole-1-yl groups, 2-methylpyrrole-3-yl groups, 2-methylpyrrole-4-yi groups, 2-methylpyrrole-5-yl groups, 3-methylpyrrole-1-yl groups, 3-methylpyrrole-2-yl groups, 3-methylpyrrole-4-yl groups, 3-methylpyrrole-5-yl groups, 2-t-butylpyrrole-4-yl groups, 3-(2-phenylpropyl)pyrrole-1-yl groups, 2-methyl-1-indolyl groups, 4-methyl-1-indolyl groups, 2-methyl-3-indolyl groups, 4-methyl-3-indolyl groups, 2-t-butyl-1-indolyl groups, 4-t-butyl-1-indolyl groups, 2-t-butyl-3-indolyl groups, and 4-t-butyl-3-indolyl groups, and the like.

Available substituted or unsubstituted alkoxycarbonyl groups are represented by —COOY2 and "Y2" may be methyl groups, ethyl groups, propyl groups, isopropyl groups, n-butyl groups, s-butyl groups, isobutyl groups, t-butyl groups, n-pentyl groups, n-hexyl groups, n-heptyl groups, n-octyl groups, hydroxymethyl groups, 1-hydroxyethyl groups, 2-hydroxyethyl groups, 2-hydroxyisobutyl groups, 1,2-dihydroxyethyl groups, 1,3-dihydroxyisopropyl groups, 2,3-dihydroxy-t-butyl groups, 1,2,3-trihydroxypropyl groups, chloromethyl groups, 1-chloroethyl groups, 2-chloroethyl groups, 2-chloroisobutyl groups, 1,2-dichloroethyl groups, 1,3-dichloroisopropyl groups, 2,3-dichloro-t-butyl groups, 1,2,3-trichloropropyl groups, bromomethyl groups, 1-bromoethyl groups, 2-bromoethyl groups, 2-bromoisobutyl groups, 1,2-dibromoethyl groups, 1,3-dibromoisopropyl groups, 2,3-dibromo-t-butyl groups, 1,2,3-tribromopropyl groups, iodomethyl groups, 1-iodoethyl groups, 2-iodoethyl groups, 2-iodoisobutyl groups, 1,2-diiodoethyl groups, 1,3-diiodoisopropyl groups, 2,3-diiodo-t-butyl groups, 1,2,3-triiodopropyl groups, aminomethyl groups, 1-aminoethyl groups, 2-aminoethyl groups, 2-aminoisobutyl groups, 1,2-diaminoethyl groups, 1,3-diaminoisopropyl groups, 2,3-diamino-t-butyl groups, 1,2,3-triaminopropyl groups, cyanomethyl groups, 1-cyanoethyl groups, 2-cyanoethyl groups, 2-cyanoisobutyl groups, 1,2-dicyanoethyl groups, 1,3-dicyanoisopropyl groups, 2,3-dicyano-t-butyl groups, 1,2,3-tricyanopropyl groups, nitromethyl groups, 1-nitroethyl groups, 2-nitroethyl groups, 2-nitroisobutyl groups, 1,2-dinitroethyl groups, 1,3-dinitroisopropyl groups, 2,3-dinitro-t-butyl groups, 1,2,3-trinitropropyl groups, and the like.

Available substituted or unsubstituted arylene groups are aromatic hydrocarbon or condensed polycyclic hydrocarbon such as substituted or unsubstituted benzene, naphthalene, anthracene, phenanthrene, naphthalene, pyrene, biphenyl, terphenyl, as well as divalent groups of complex ring compounds or condensed complex ring compounds from which two hydrogen atoms have been eliminated, such as substituted or unsubstituted carbazole, pyrrole, thiophene, furan, imidazole, pyrazole isothiazole, pyridine, pyrazine, pyrimidine, pyridazine, frazane, thianthrene, isobenzofuran, phenoxazine, indolizine, indole, isoindole, 1H-indazole, purine, quinoline, isoquinoline, phthalazine, naphthyridine, quinoxaline, quinazoline, cinnoline, pteridine, carbazole, β-carbazoline, phenanthridine, acridine, perimidine, phenanthroline, phenazine, phenothiazine, phenozazine.

Available substituted or unsubstituted aromatic hydrocarbon groups of trivalent are substituted or unsubstituted benzene, naphthalene, anthracene, phenanthrene, naphthalene, pyrene, biphenyl, terphenyl.

Available substituted or unsubstituted aromatic complex ring groups of trivalent are trivalent groups of complex ring compounds or condensed complex ring compounds from which three hydrogen atoms are eliminated, such as substituted or unsubstituted carbazole, pyrrole, thiophene, furan, imidazole, pyrazole, isothiazole, pyridine, pyrazine, pyrimidine, pyridazine, frazane, thianthrene, isobenzofuran, phenoxazine, indolizine, indole, isoindole, 1H-indazole, purine, quinoline, isoquinoline, phthalazine, naphthyridine, quinoxaline, quinazoline, cinnoline, pteridine, carbazole, β-carbazoline, phenanthridine, acridine, perimidine, phenanthroline, phenazine, phenothiazine, phenozazine.

Available substituted or unsubstituted alkylene groups are divalent groups of alkane, from which two hydrogen atoms have been eliminated, such as substituted or unsubstituted methane, ethane, propane, n-butane, 2-methylpropane, n-pentane, 2-methylbutane, 2,2-dimethylpropane, n-hexane, 2-methyl-n-pentane, 3-methyl-n-pentane, 2,2-dimethylbutane, 2,3-dimethylbutane.

Available substituted or unsubstituted alkenylene groups are divalent groups of alkene, from which two hydrogen atoms have been eliminated, such as substituted or unsubstituted ethylene, propylene, 1-butene, 2-butene, 1,3-butadiene.

Available substituted or unsubstituted cycloalkylene groups are divalent groups of cycloalkane, from which two hydrogen atoms have been eliminated, such as substituted or unsubstituted cyclopropane, cyclobutane, cyclopentane, cyclohexane.

Substituents of those polyhydric groups may be halogen atoms, hydroxyl group, substituted or unsubstituted amino group, nitro group, cyano group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic complex ring group, substituted or unsubstituted aralkyl group, substituted or unsubstituted aryloxy group, substituted or unsubstituted alkoxy carbonyl group, or carboxyl group.

Examples of divalent groups forming a ring are tetramethylene groups, pentamethylene groups, hexamethylene groups, diphenylmethane-2,2'-diyl groups, diphenylethane-3,3'-diyl groups, diphenylpropane-4,4'-diyl groups, 1,3-butadienyl-1,4-en groups.

As metals forming oxime metal complex, there are available aluminum, beryllium, bismuth, cadmium, curium, cobalt, copper, iron, gallium, germanium, mercury, indium, lanthanum, magnesium, molybdenum, niobium, antimony, scandium, tin, tantalum, thulium, titanium, uranium, tungsten, zirconium, vanadium, zinc and the like.

Examples of compounds represented by the general formula (1) used for the organic EL device in accordance with the present invention will hereinafter be shown, but the compounds represented by the general formula (1) are not limited to these examples:

(7)
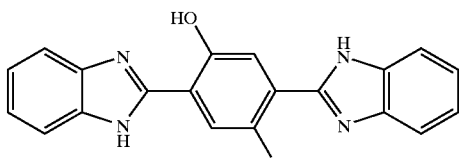

(8)
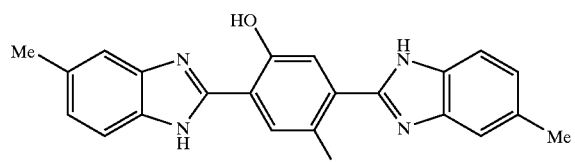

(9)
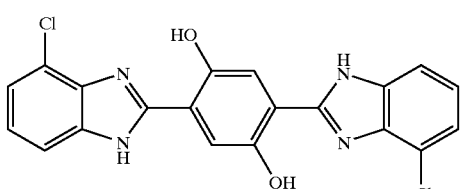

(10)
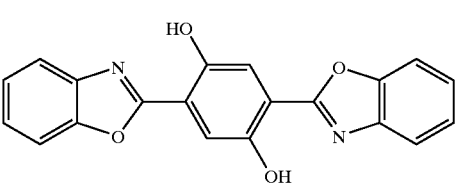

(11)
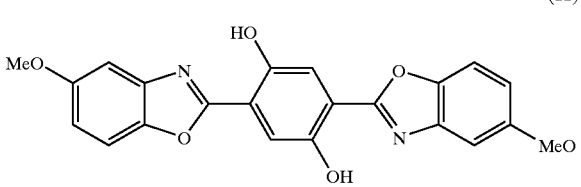

(12)
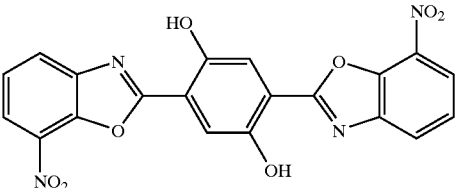

(13)
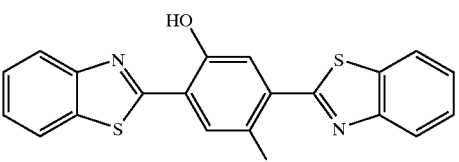

(14)
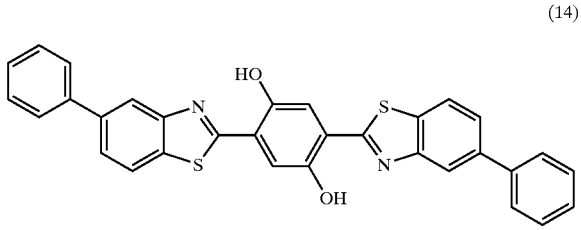

(15)

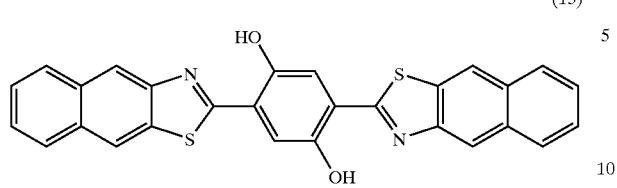

(16)

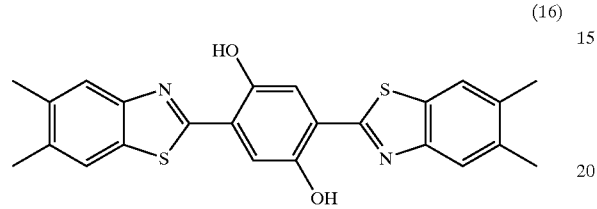

Examples of compounds represented by the general formula (2) used for the organic EL device in accordance with the present invention will hereinafter be shown, but the compounds represented by the general formula (2) are not limited to these examples:

(17)

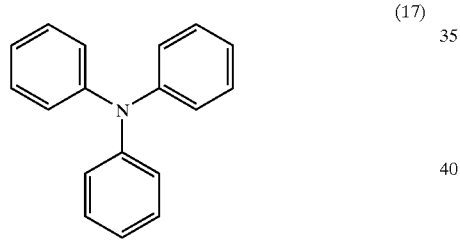

(18)

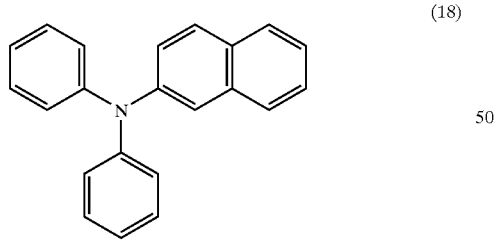

(19)

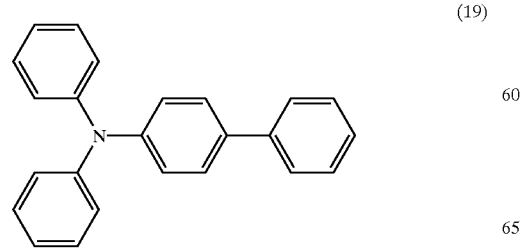

(20)

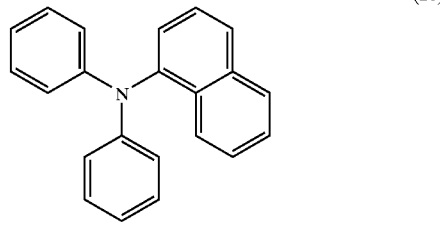

(21)

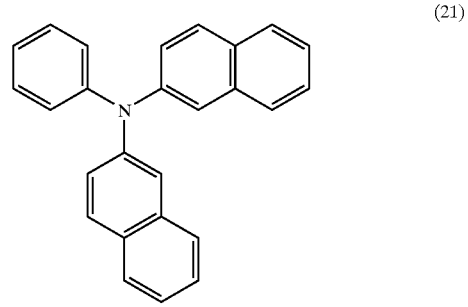

(22)

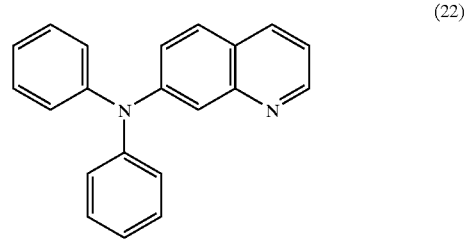

(23)

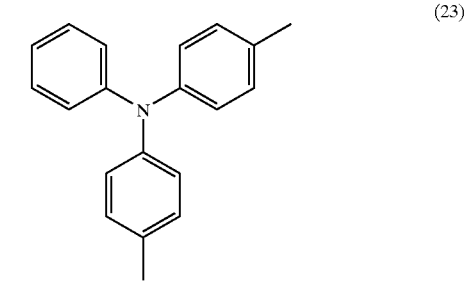

(24)

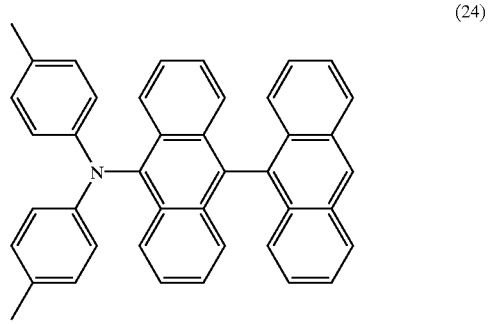

Examples of compounds represented by the general formula (3) used for the organic EL device in accordance with the present invention will hereinafter be shown, but the compounds represented by the general formula (3) are not limited to these examples:

(25)
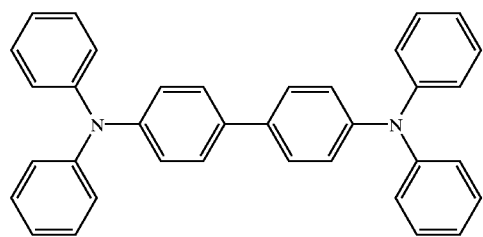

(26)
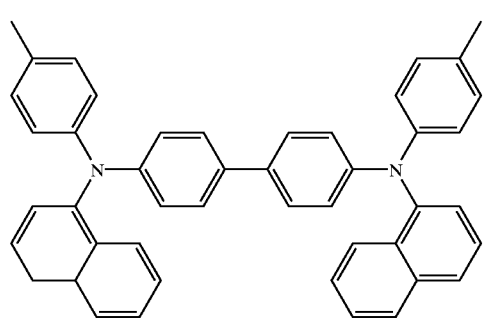

(27)
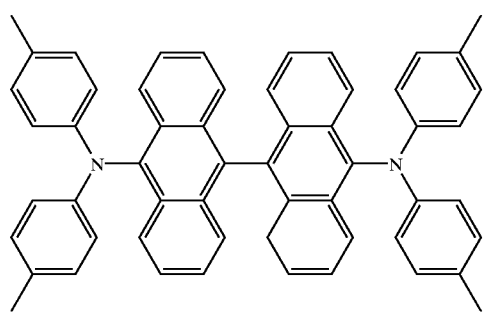

(28)
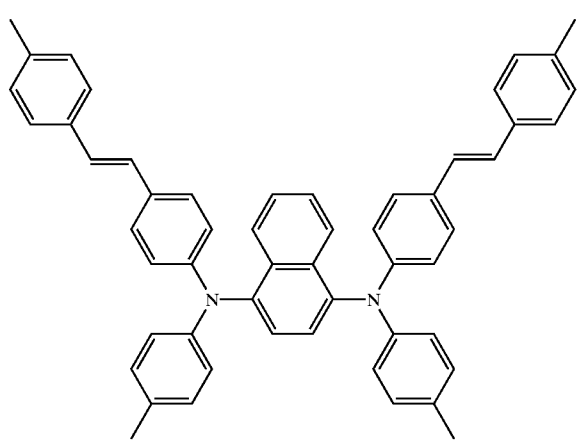

Examples of compounds represented by the general formula (4) used for the organic EL device in accordance with the present invention will hereinafter be shown, but the compounds represented by the general formula (4) are not limited to these examples:

(29)
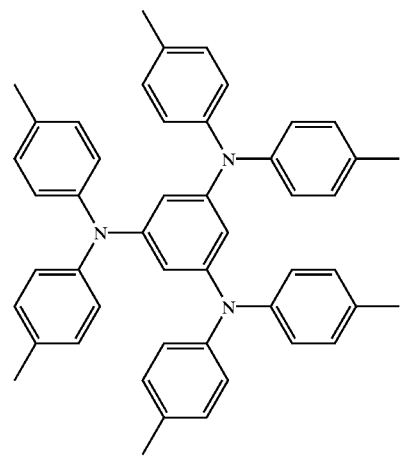

(30)
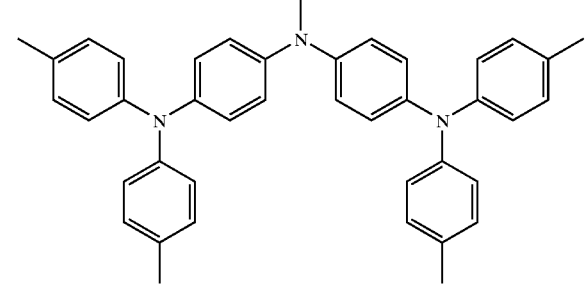

Examples of compounds represented by the general formula (5) used for the organic EL device in accordance with the present invention will hereinafter be shown, but the compounds represented by the general formula (5) are not limited to these examples:

(31)
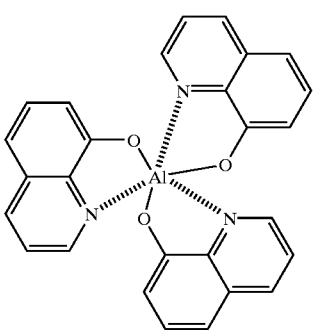

(32)
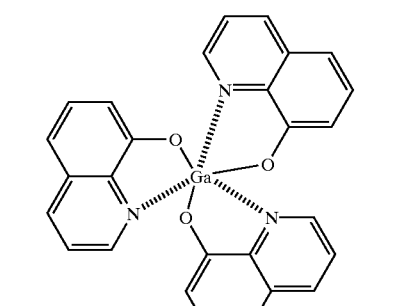
(33)
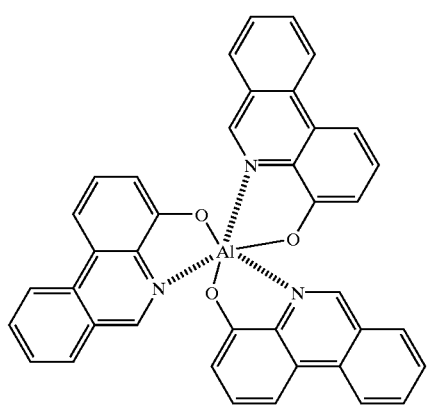
(34)
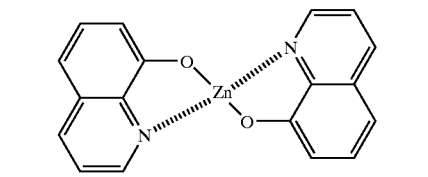
(35)
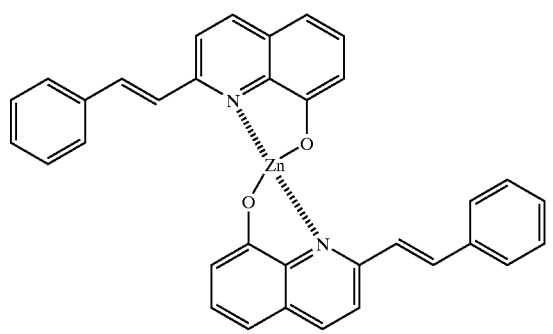
(36)
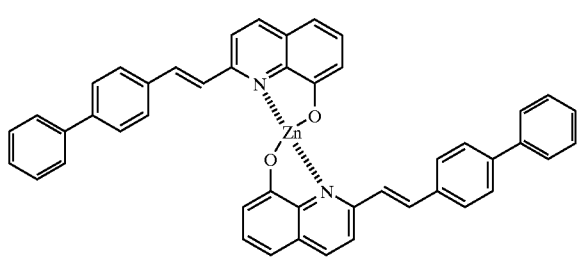
(37)
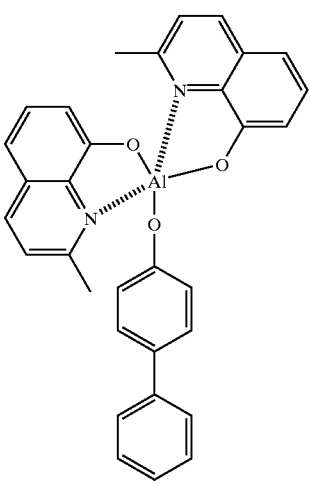
(38)
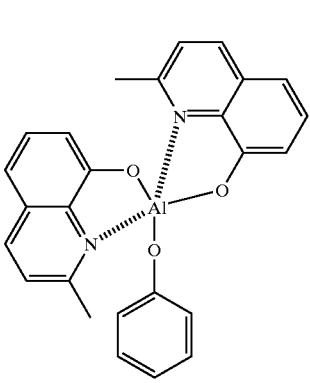
(39)
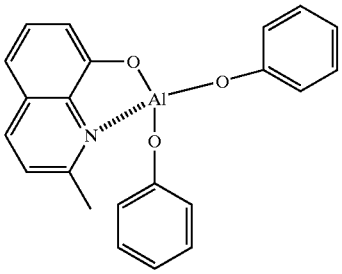
Examples of compounds represented by the general formula (6) used for the organic EL device in accordance with the present invention will hereinafter be shown, but the compounds represented by the general formula (6) are not limited to these examples:

(40)

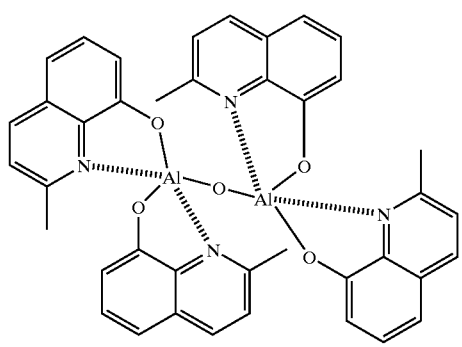

(41)

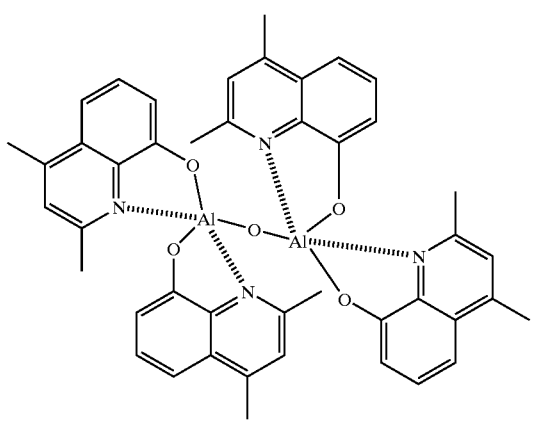

(42)

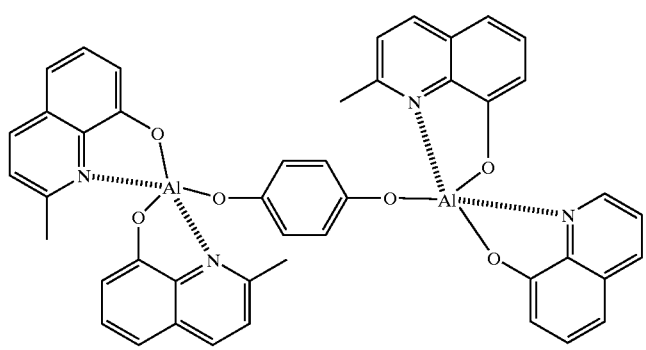

(43)

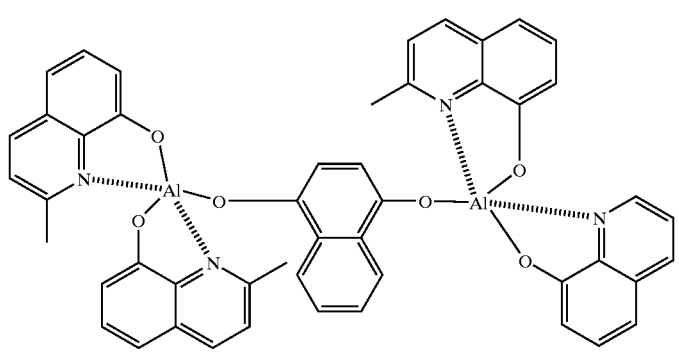

(44)

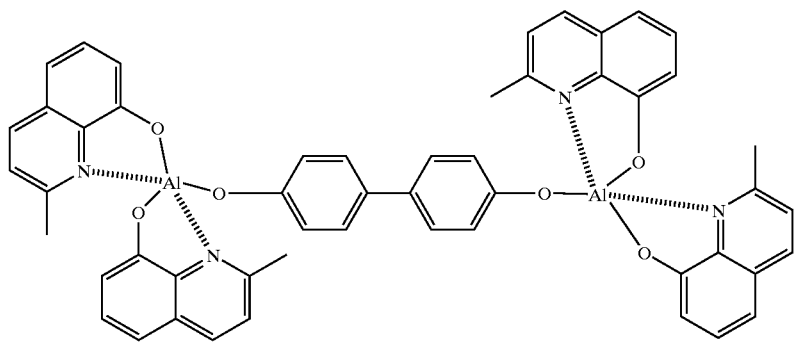

Figure 1:
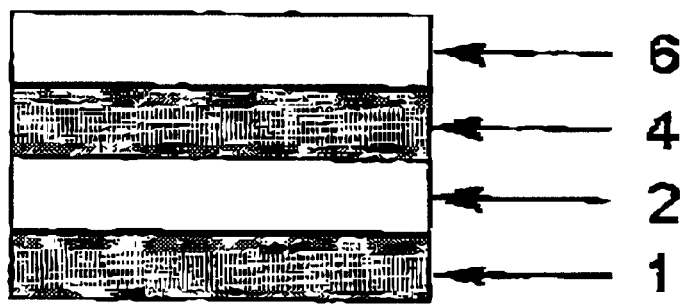
FIG. 1 is a cross sectional view illustrative of an organic EL device in accordance with example 1 of the present invention.

In the drawings, the reference numerals denote the following components:

1: substrate
2: anode
3: hole transport layer
4: luminescent layer
5: electron transport layer
6: cathode

DESCRIPTION OF PREFERRED EMBODIMENTS

The organic EL device in accordance with the present invention has a structure of laminations of one or two or more organic thin films between a cathode and an anode. The following four examples may be considered.

Figure 3:
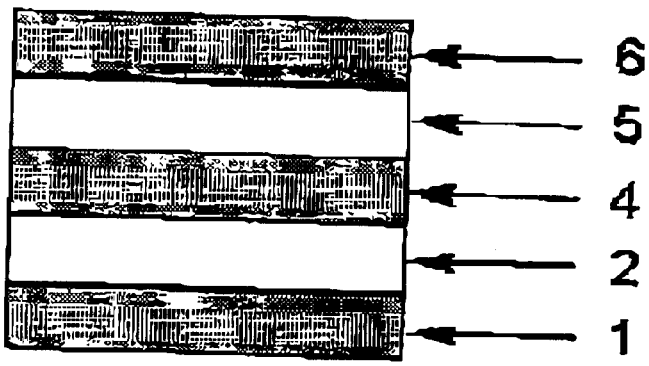
FIG. 3 is a cross sectional view illustrative of an organic EL device in accordance with example 30 of the present invention.
Figure 4:
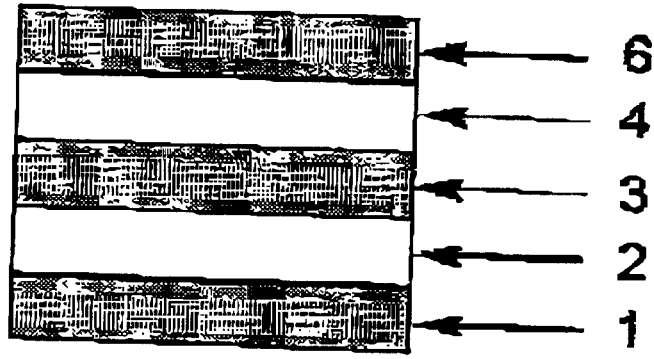
FIG. 4 is a cross sectional view illustrative of an organic EL device in accordance with example 35 of the present invention.

(1) anode/luminescent layer/cathode (referring to FIG. 1)
(2) anode/hole transport layer/luminescent layer/electron transport layer/cathode (referring to FIG. 2)
(3) anode/ luminescent layer/electron transport layer/ cathode (referring to FIG. 3)
(4) anode/hole transport layer/luminescent layer/ cathode (referring to FIG. 4)

The compounds represented by the general formula (1) are mixed with luminescent materials represented by the general formulae (2) through (6) to be used for the luminescent layer of the above organic EL device. It is possible to mix, in addition to the compounds represented by the general formula (1), other materials of hole transport material, luminescent materials and electron transport materials.

The hole transport materials to be used in the organic EL device in accordance with the present invention should not be limited. Any compounds normally used as the hole transport materials may be available. For example, compounds 45–50, such as bis(di(p-tolyl)aminophenyl)-1,1-cyclohexane (compound 45), N,N'-diphenyl-N,N'-bis(3-methylphenyl)-1,1'-biphenyl-4,4'-diamine (compound 46), N,N'-diphenyl-N-N'-bis(1-naphthyl)-(1,1'-biphenyl)-4,4'-diamine (compound 47), and the like as well as compounds (17) through (30) such as diamine, triamine, tetraamine and starburst type molecules (compounds 48–50).

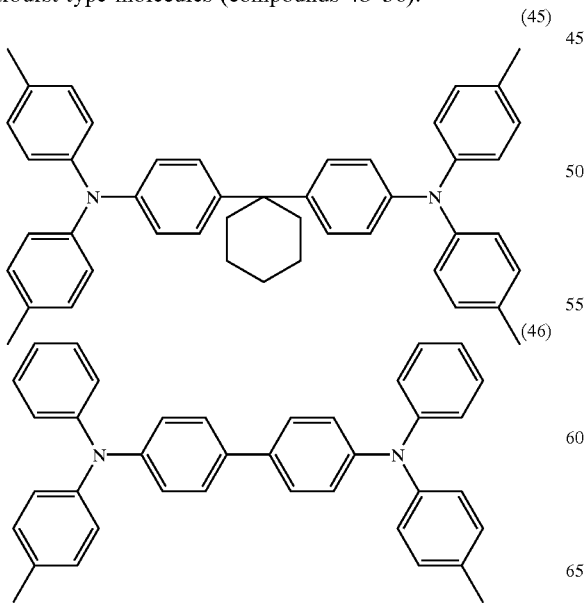

(45)

(46)

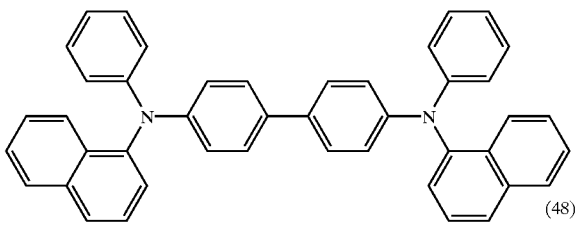

(47)

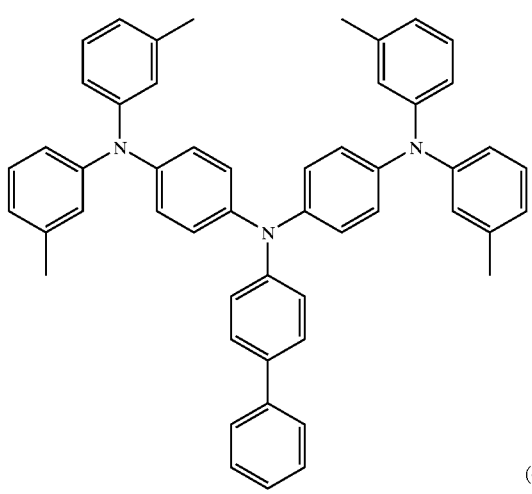

(48)

(49)

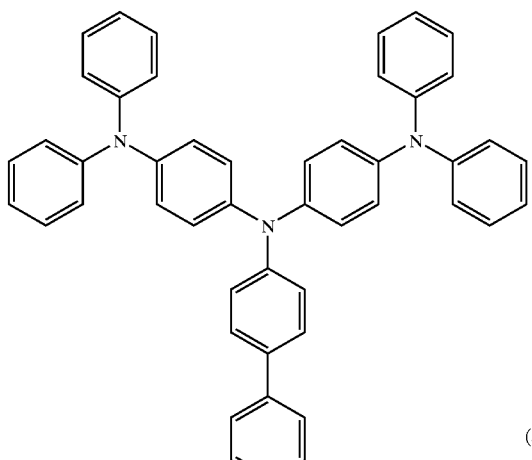

(50)

The electron transport materials to be used in the organic EL device in accordance with the present invention should not be limited. Any compounds normally used as the electron transport materials may be available. For example, compounds 51–54, such as oxadiazole derivatives such as 2-(4-biphenyl)-5-(4-t-butylphenyl)-1,3,4-oxadiazole (compound 51), bis{2-(4-t-butylphenyl)-1,3,4-oxadiazole}-m-phenylene (compound 52), as well as triazole derivatives (compounds 53, 54). Oxime metal complex of compounds (31) through (44) may also be available as the electron transport material.

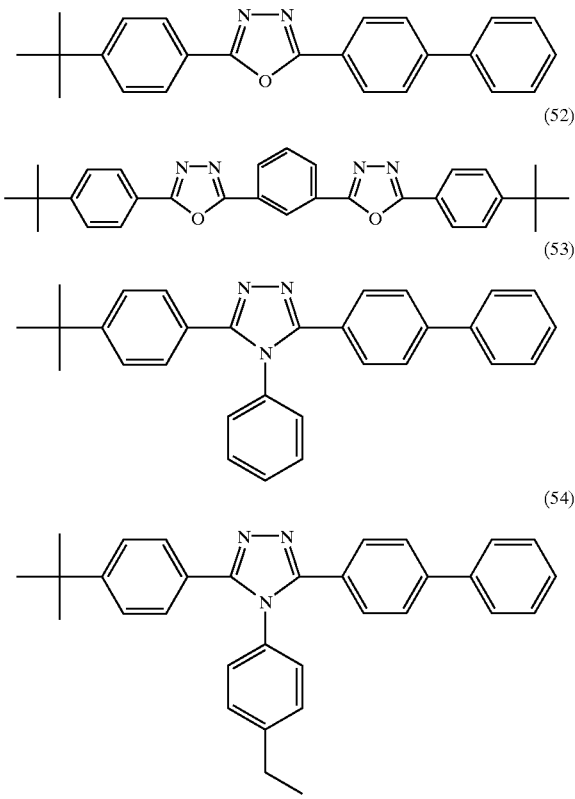

The anode of the organic thin film EL device may serve to inject holes into the hole transport layer and it is effective that the anode has a work function of not less than 4.5 eV. Available anode materials for the organic EL device in accordance with the present invention are, for example, indium tin oxide alloy (ITO), tin oxide (NESA), gold, silver, platinum, and copper.

The cathode serves to inject electrons into the electron transport layer, for which reason it is preferable that the cathode material is smaller in work function than the anode material. The cathode material should not be limited but, there are, for example, available indium, aluminum, magnesium, magnesium-indium alloy, magnesium-aluminum alloy, aluminum-lithium alloy, aluminum-scandium-lithium alloy, magnesium-silver alloy and the like.

Methods for forming individual layers of the organic EL device in accordance with the present invention should not be limited. Known techniques are available such as a vacuum evaporation method, and a spin coating method. The organic thin film layer containing a mixture of the compound represented by the above general formula (1) with a luminescent material represented by the general formulae (2) through (6) may be formed by known methods such as a vacuum evaporation method, a molecular beam epitaxy method, a dipping method with use of a solution dissolved into a solvent, application methods such as a spin coating method, a scanting method, a barcode method, and a roll coating method.

Thicknesses of the individual layers of the organic EL device in accordance with the present invention should not be limited. If, however, the thickness is too thin, then defects such as pin holes are likely to be formed. If the thickness is too thick, then a high voltage application is required and the efficiency decreases. For those reasons, the thicknesses of the individual layers are preferably in the range of one or a few nanometers through one micrometer.

EXAMPLES

Whereas examples of the present invention will hereinafter be described, the present invention should not be limited to the following examples unless the subject of the present invention is changed.

There are shown examples wherein the mixture of the compound represented by the general formula (1) with the luminescent materials represented by the general formulae (2) through (6) is used for the luminescent layer (examples 1 through 29). There are shown examples wherein the mixture of the compound represented by the general formula (1) with the luminescent materials represented by the general formulae (2) through (6) and the electron transport material are used to form mixed thin films for the luminescent layer (examples 30 through 34). There are shown examples wherein the mixture of the compound represented by the general formula (1) with the luminescent materials represented by the general formulae (2) through (6) and the hole transport material are used to form mixed thin films for the luminescent layer (examples 35 through 39). The bis-2, 5-(2-benzazoyl) hydroquinone compound was synthesized in accordance with *Chem. Commun.*, 1551 (1971).

Example 1

A cross sectioned structure of an organic EL device in accordance with the present invention is shown in FIG. 1. The organic EL device in accordance with the present invention comprises a glass substrate 1, an anode 2 and a cathode 6 formed over the glass substrate 1, and a luminescent layer 4 sandwiched between the anode 2 and the cathode 6.

Fabrication processes for the organic EL device in accordance with example 1 will be described below. An ITO was formed on a glass substrate 1 by a sputtering method so that a sheet resistance becomes 20 Ω/□, thereby forming an anode 2. As a luminescent layer 4, a compound (7) and a compound (17) were co-evaporated at a weight ratio of 1:10 to form a thin film of 50 nanometers in thickness.

As a cathode 6, a magnesium-silver alloy was vacuum-evaporated to form a film of 200 nanometers in thickness, thereby forming an organic EL device. A direct current voltage of 5V was applied across the anode 2 and the cathode 6 of this organic EL device. A red-color luminescence of 40 cd/m$^2$ was obtained.

Example 2

The organic EL device was fabricated by the same processes as in the embodiment 1 except that as the luminescent layer 4, a compound (10) and a compound (24) were co-evaporated at a weight ratio of 1:10 to form a thin film of 50 nanometers in thickness. A direct current voltage of 5V was applied across the anode 2 and the cathode 6 of this organic EL device. A red-color luminescence of 60 cd/m$^2$ was obtained.

Example 3

The organic EL device was fabricated by the same processes as in the embodiment 1 except that as the luminescent layer 4, a compound (13) and a compound (26) were co-evaporated at a weight ratio of 1:10 to form a thin film of 50 nanometers in thickness. A direct current voltage of 5V was applied across the anode 2 and the cathode 6 of this organic EL device. A red-color luminescence of 50 cd/m$^2$ was obtained.

Example 4

The organic EL device was fabricated by the same processes as in the embodiment 1 except that as the luminescent layer 4, a compound (13) and a compound (24) were co-evaporated at a weight ratio of 1:10 to form a thin film of 50 nanometers in thickness. A direct current voltage of 5V was applied across the anode 2 and the cathode 6 of this organic EL device. A red-color luminescence of 40 cd/m$^2$ was obtained.

Example 5

The organic EL device was fabricated by the same processes as in the embodiment 1 except that as the luminescent layer 4, a compound (13) and a compound (28) were co-evaporated at a weight ratio of 1:10 to form a thin film of 50 nanometers in thickness. A direct current voltage of 5V was applied across the anode 2 and the cathode 6 of this organic EL device. A red-color luminescence of 60 cd/m$^2$ was obtained.

Example 6

The organic EL device was fabricated by the same processes as in the embodiment 1 except that as the luminescent layer 4, a compound (13) and a compound (31) were co-evaporated at a weight ratio of 1:10 to form a thin film of 50 nanometers in thickness. A direct current voltage of 5V was applied across the anode 2 and the cathode 6 of this organic EL device. A red-color luminescence of 60 cd/m$^2$ was obtained.

Example 7

The organic EL device was fabricated by the same processes as in the embodiment 1 except that as the luminescent layer 4, a compound (13) and a compound (33) were co-evaporated at a weight ratio of 1:10 to form a thin film of 50 nanometers in thickness. A direct current voltage of 5V was applied across the anode 2 and the cathode 6 of this organic EL device. A red-color luminescence of 40 cd/m$^2$ was obtained.

Example 8

The organic EL device was fabricated by the same processes as in the embodiment 1 except that as the luminescent layer 4, a compound (13) and a compound (40) were co-evaporated at a weight ratio of 1:10 to form a thin film of 50 nanometers in thickness. A direct current voltage of 5V was applied across the anode 2 and the cathode 6 of this organic EL device. A red-color luminescence of 60 cd/m$^2$ was obtained.

Example 9

A cross sectioned structure of an organic EL device in accordance with the example 9 is the same as the cross sectioned structure of the organic EL device in the example 1 shown in FIG. 1. Fabrication processes for the organic EL device in accordance with example 9 will be described below. An ITO was formed on a glass substrate 1 by a sputtering method so that a sheet resistance becomes 20 Ω/□, thereby forming an anode. A chloroform solution including a mixture a compound (7) with a compound (17) at a weight ratio of 1:10 was used to carry out a spin coating method to form a luminescent layer 4 of 40 nanometers in thickness. As a cathode 6, a magnesium-silver alloy was vacuum-evaporated to form a film of 200 nanometers in thickness, thereby forming an organic EL device. A direct current voltage of 5V was applied across the anode 2 and the cathode 6 of this organic EL device. A red-color luminescence of 40 cd/m$^2$ was obtained.

Example 10

The organic EL device was fabricated by the same processes as in the embodiment 9 except that a chloroform solution including a mixture of a compound (8) with a compound (25) at a weight ratio of 1:10 was used to carry out a spin coating method to form a luminescent layer 4 of 40 nanometers in thickness. A direct current voltage of 5V was applied across the anode 2 and the cathode 6 of this organic EL device. A red-color luminescence of 50 cd/m$^2$ was obtained.

Example 11

Figure 2:
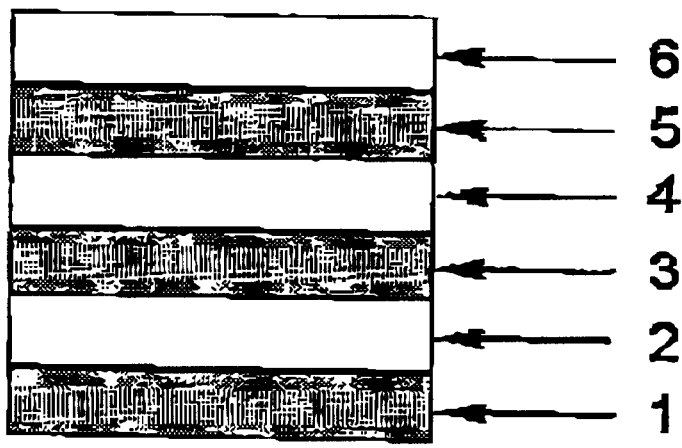
FIG. 2 is a cross sectional view illustrative of an organic EL device in accordance with example 11 of the present invention.

A cross sectioned structure of an organic EL device in accordance with example 11 is shown in FIG. 2. The organic EL device in accordance with this example comprises a glass substrate 1, an anode 2 and a cathode 6 formed over the glass substrate 1, and a hole transport layer 3, a luminescent layer 4 and an electron transport layer 5 sandwiched between the anode 2 and the cathode 6.

Fabrication processes for the organic EL device in accordance with example 11 will be described below. An ITO was formed on a glass substrate 1 by a sputtering method so that a sheet resistance becomes 20 Ω/□, thereby forming an anode 2. As a hole transport layer 3, N,N'-diphenyl-N,N'-bis(3-methylphenyl)-1,1'-biphenyl-4,4'-diamine (compound 46) was formed by a vacuum evaporation to form a layer of 50 nanometers in thickness. As a luminescent layer 4, a compound (9) and a compound (18) were co-evaporated at a weight ratio of 1:10 to form a thin film of 40 nanometers in thickness. As an electron transport layer 5, 2-(4-biphenyl)-5-(4-t-butylphenyl)-1,3,4-oxadiazole (compound 51) was formed by a vacuum evaporation to form a layer of 20 nanometers in thickness. As a cathode 6, a magnesium-silver alloy was vacuum-evaporated to form a film of 200 nanometers in thickness, thereby forming an organic EL device.

A direct current voltage of 10V was applied across the anode 2 and the cathode 6 of this organic EL device. A red-color luminescence of 400 cd/m$^2$ was obtained.

Example 12

The organic EL device was fabricated by the same processes as in the embodiment 11 except that a compound (11) and a compound (19) were co-evaporated at a weight ratio of 1:10. A direct current voltage of 10V was applied across the anode 2 and the cathode 6 of this organic EL device. A red-color luminescence of 500 cd/m$^2$ was obtained.

Example 13

The organic EL device was fabricated by the same processes as in the embodiment 11 except that a compound (12) and a compound (22) were co-evaporated at a weight ratio of 1:10. A direct current voltage of 10V was applied across the anode 2 and the cathode 6 of this organic EL device. A red-color luminescence of 500 cd/m$^2$ was obtained.

Example 14

The organic EL device was fabricated by the same processes as in the embodiment 11 except that a compound (14)

and a compound (24) were co-evaporated at a weight ratio of 1:10. A direct current voltage of 10V was applied across the anode 2 and the cathode 6 of this organic EL device. A red-color luminescence of 400 cd/m$^2$ was obtained.

Example 15

The organic EL device was fabricated by the same processes as in the embodiment 11 except that a compound (15) and a compound (26) were co-evaporated at a weight ratio of 1:10. A direct current voltage of 10V was applied across the anode 2 and the cathode 6 of this organic EL device. A red-color luminescence of 550 cd/m$^2$ was obtained.

Example 16

The organic EL device was fabricated by the same processes as in the embodiment 11 except that a compound (16) and a compound (27) were co-evaporated at a weight ratio of 1:10. A direct current voltage of 10V was applied across the anode 2 and the cathode 6 of this organic EL device. A red-color luminescence of 560 cd/m$^2$ was obtained.

Example 17

The organic EL device was fabricated by the same processes as in the embodiment 11 except that a compound (10) and a compound (28) were co-evaporated at a weight ratio of 1:10. A direct current voltage of 10V was applied across the anode 2 and the cathode 6 of this organic EL device. A red-color luminescence of 580 cd/m$^2$ was obtained.

Example 18

The organic EL device was fabricated by the same processes as in the embodiment 11 except that a compound (13) and a compound (24) were co-evaporated at a weight ratio of 1:10. A direct current voltage of 10V was applied across the anode 2 and the cathode 6 of this organic EL device. A red-color luminescence of 800 cd/m$^2$ was obtained.

Example 19

The organic EL device was fabricated by the same processes as in the embodiment 11 except that a compound (13) and a compound (26) were co-evaporated at a weight ratio of 1:10. A direct current voltage of 10V was applied across the anode 2 and the cathode 6 of this organic EL device. A red-color luminescence of 960 cd/m$^2$ was obtained.

Example 20

The organic EL device was fabricated by the same processes as in the embodiment 11 except that a compound (13) and a compound (28) were co-evaporated at a weight ratio of 1:10. A direct current voltage of 10V was applied across the anode 2 and the cathode 6 of this organic EL device. A red-color luminescence of 800 cd/m$^2$ was obtained.

Example 21

The organic EL device was fabricated by the same processes as in the embodiment 11 except that a compound (13) and a compound (29) were co-evaporated at a weight ratio of 1:10. A direct current voltage of 10V was applied across the anode 2 and the cathode 6 of this organic EL device. A red-color luminescence of 900 cd/m$^2$ was obtained.

Example 22

The organic EL device was fabricated by the same processes as in the embodiment 11 except that a compound (13) and a compound (33) were co-evaporated at a weight ratio of 1:10. A direct current voltage of 10V was applied across the anode 2 and the cathode 6 of this organic EL device. A red-color luminescence of 1000 cd/m$^2$ was obtained.

Example 23

The organic EL device was fabricated by the same processes as in the embodiment 11 except that a compound (13) and a compound (35) were co-evaporated at a weight ratio of 1:10. A direct current voltage of 10V was applied across the anode 2 and the cathode 6 of this organic EL device. A red-color luminescence of 950 cd/m$^2$ was obtained.

Example 24

The organic EL device was fabricated by the same processes as in the embodiment 11 except that a compound (13) and a compound (37) were co-evaporated at a weight ratio of 1:10. A direct current voltage of 10V was applied across the anode 2 and the cathode 6 of this organic EL device. A red-color luminescence of 1200 cd/m$^2$ was obtained.

Example 25

The organic EL device was fabricated by the same processes as in the embodiment 11 except that a compound (13) and a compound (40) were co-evaporated at a weight ratio of 1:10. A direct current voltage of 10V was applied across the anode 2 and the cathode 6 of this organic EL device. A red-color luminescence of 1000 cd/m$^2$ was obtained.

Example 26

The organic EL device was fabricated by the same processes as in the embodiment 11 except that a compound (13) and a compound (43) were co-evaporated at a weight ratio of 1:10. A direct current voltage of 10V was applied across the anode 2 and the cathode 6 of this organic EL device. A red-color luminescence of 1200 cd/m$^2$ was obtained.

Example 27

The organic EL device was fabricated by the same processes as in the embodiment 19 except that as the hole transport layer 3, N,N'-diphenyl-N-N'-bis(1-naphthyl)-(1,1'-biphenyl)-4,4'-diamine (compound 47) was used and as the electron transport layer 5, bis{2-(4-t-butylphenyl)-1,3,4-oxadiazole}-m-phenylene (compound 52) was used. A direct current voltage of 10V was applied across the anode 2 and the cathode 6 of this organic EL device. A red-color luminescence of 1000 cd/m$^2$ was obtained.

Example 28

The organic EL device was fabricated by the same processes as in the embodiment 19 except that as the hole transport layer 3, starburst type molecule (compound 48) was used and as the electron transport layer 5, triazole derivative (compound 53) was used. A direct current voltage of 10V was applied across the anode 2 and the cathode 6 of this organic EL device. A red-color luminescence of 1300 cd/m$^2$ was obtained.

Example 29

The organic EL device was fabricated by the same processes as in the embodiment 19 except that as the hole transport layer 3, starburst type molecule (compound 49) was used and as the electron transport layer 5, triazole derivative (compound 54) was used. A direct current voltage of 10V was applied across the anode 2 and the cathode 6 of this organic EL device. A red-color luminescence of 1400 cd/m$^2$ was obtained.

Example 30

A cross sectioned structure of an organic EL device in accordance with example 30 is shown in FIG. 3. The organic EL device in accordance with this example comprises a glass substrate 1, an anode 2 and a cathode 6 formed over the glass substrate 1, and a luminescent layer 4 and an electron transport layer 5 sandwiched between the anode 2 and the cathode 6.

Fabrication processes for the organic EL device in accordance with example 30 will be described below. An ITO was formed on a glass substrate 1 by a sputtering method so that a sheet resistance becomes 20 Ω/□, thereby forming an anode 2. As a luminescent layer 4, N,N'-diphenyl-N-N'-bis (1-naphthyl)-(1,1'-biphenyl)-4,4'-diamine (compound 47), a compound (9) and a compound (18) were co-evaporated at a weight ratio of 1:1:10 to form a thin film of 50 nanometers in thickness. As an electron transport layer 5, triazole derivative (compound 53) was formed by a vacuum evaporation to form a layer of 50 nanometers in thickness. As a cathode 6, a magnesium-silver alloy was vacuum-evaporated to form a film of 200 nanometers in thickness, thereby forming an organic EL device.

A direct current voltage of 10V was applied across the anode 2 and the cathode 6 of this organic EL device. A red-color luminescence of 600 cd/m$^2$ was obtained.

Example 31

The organic EL device was fabricated by the same processes as in the embodiment 30 except that in place of the compound (26), a compound (30) was used. A direct current voltage of 10V was applied across the anode 2 and the cathode 6 of this organic EL device. A red-color luminescence of 750 cd/m$^2$ was obtained.

Example 32

The organic EL device was fabricated by the same processes as in the embodiment 30 except that a compound (13) and a compound (25) were co-evaporated at a weight ratio of 1:10 to form a thin film of 50 nanometers in thickness. A direct current voltage of 10V was applied across the anode 2 and the cathode 6 of this organic EL device. A red-color luminescence of 710 cd/m$^2$ was obtained.

Example 33

The organic EL device was fabricated by the same processes as in the embodiment 32 except that in place of the compound (25), a compound (29) was used. A direct current voltage of 10V was applied across the anode 2 and the cathode 6 of this organic EL device. A red-color luminescence of 780 cd/m$^2$ was obtained.

Example 34

A cross sectioned structure of an organic EL device in accordance with example 34 is the same as the cross sectioned structure of the organic EL device in accordance with example 30 shown in FIG. 3. Fabrication processes for the organic EL device in accordance with example 34 will be described below.

An ITO was formed on a glass substrate 1 by a sputtering method so that a sheet resistance becomes 20 Ω/□, thereby forming an anode 2. A chloroform solution containing N,N'-diphenyl-N-N'-bis(1-naphthyl)-(1,1'-biphenyl)-4,4'-diamine (compound 47), a compound (10) and a compound (25) at a weight ratio of 1:1:10 was used to carry out a spin coating method thereby to form a luminescent layer 4 of 40 nanometers in thickness. A triazole derivative (compound 54) was vacuum-evaporated to form an electron transport layer 5 of 50 nanometers in thickness. As a cathode 6, a magnesium-silver alloy was vacuum-evaporated to form a film of 200 nanometers in thickness, thereby forming an organic EL device.

A direct current voltage of 10V was applied across the anode 2 and the cathode 6 of this organic EL device. A red-color luminescence of 580 cd/m$^2$ was obtained.

Example 35

A cross sectioned structure of an organic EL device in accordance with example 35 is shown in FIG. 4. The organic EL device in accordance with this example comprises a glass substrate 1, an anode 2 and a cathode 6 formed over the glass substrate 1, and a hole transport layer 3 and a luminescent layer 4 sandwiched between the anode 2 and the cathode 6.

Fabrication processes for the organic EL device in accordance with example 30 will be described below. An ITO was formed on a glass substrate 1 by a sputtering method so that a sheet resistance becomes 20 Ω/□, thereby forming an anode 2. As a hole transport layer 3, N,N'-diphenyl-N-N'-bis(1-naphthyl)-(1,1'-biphenyl)-4,4'-diamine (compound 47) was vacuum-evaporated to form a layer of 50 nanometers in thickness. As a luminescent layer 4, a compound (13) and a compound (31) were co-evaporated at a weight ratio of 1:10 to form a thin film of 50 nanometers in thickness. As a cathode 6, a magnesium-silver alloy was vacuum-evaporated to form a film of 200 nanometers in thickness, thereby forming an organic EL device.

A direct current voltage of 10V was applied across the anode 2 and the cathode 6 of this organic EL device. A red-color luminescence of 790 cd/m$^2$ was obtained.

Example 36

The organic EL device was fabricated by the same processes as in the embodiment 35 except that in place of the compound (31), a compound (32) was used. A direct current voltage of 10V was applied across the anode 2 and the cathode 6 of this organic EL device. A red-color luminescence of 900 cd/m$^2$ was obtained.

Example 37

The organic EL device was fabricated by the same processes as in the embodiment 35 except that in place of the compound (31), a compound (39) was used. A direct current voltage of 10V was applied across the anode 2 and the cathode 6 of this organic EL device. A red-color luminescence of 910 cd/m$^2$ was obtained.

Example 38

The organic EL device was fabricated by the same processes as in the embodiment 35 except that in place of the compound (31), a compound (44) was used. A direct current voltage of 10V was applied across the anode 2 and the cathode 6 of this organic EL device. A red-color luminescence of 770 cd/m$^2$ was obtained.

Example 39

The organic EL device was fabricated by the same processes as in the embodiment 35 except that a compound (11), a compound (13), and a compound (37) were co-evaporated at a weight ratio of 2:1:10 to form a thin film of 50 nanometers in thickness. A direct current voltage of 10V was applied across the anode 2 and the cathode 6 of this organic EL device. A red-color luminescence of 840 cd/m$^2$ was obtained.

Effect of the Invention

As described above, in accordance with the organic electroluminescence device of the present invention, at least one layer of the organic thin film layers contains a bis-2,5-(2-benzazoyl) hydroquinone compound represented by the general formula (1), so that as compared to the conventional organic EL device, the luminescent brightness and the color purity are higher and an operational stability is superior to obtain the red-color luminescence.

What is claimed is:

1. An organic electroluminescence device comprising:
   a cathode;
   an anode; and
   at least one organic thin film between said cathode and said anode, said film comprising a luminescent layer comprising at most two compounds conferring luminescence, electron transport and hole transport properties to said luminescent layer, one of said at most two compounds being a bis-2,5-(2-benzazolyl) hydroquinone compound represented by a first formula:

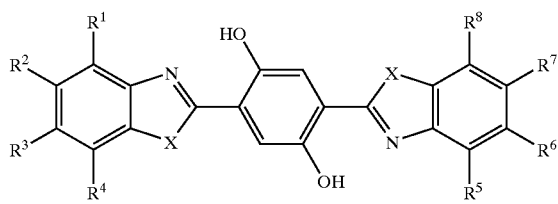

wherein each of $R^1$–$R^8$ independently represents hydrogen atom, halogen atom, hydroxy group, substituted or unsubstituted amino group, nitro group, cyano group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic complex ring group, substituted or unsubstituted aralkyl group, substituted or unsubstituted aryloxy group, substituted or unsubstituted alkoxy carbonyl group, or carboxyl group, and any two of $R^1$–$R^8$ may form a ring and "X" represents "NH", "O" or "S".

2. The organic electroluminescence device as claimed in claim 1, wherein said luminescent layer comprises a mixture of said compound of said first formula and an aromatic amine compound represented by a second formula:

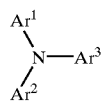

wherein each of $Ar^1$–$Ar^3$ independently represents substituted or unsubstituted aromatic hydrocarbon group, or substituted or unsubstituted aromatic complex ring group, and any two of substituents possessed by $Ar^1$–$Ar^3$ may form a ring.

3. The organic electroluminescence device as claimed in claim 1, wherein said luminescent layer comprises a mixture of said compound of said first formula and an aromatic diamine compound represented by a third formula:

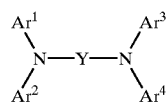

wherein each of $Ar^1$–$Ar^4$ independently represents substituted or unsubstituted aromatic hydrocarbon group, or substituted or unsubstituted aromatic complex ring group, and "Y" represents substituted or unsubstituted arylene group, any two of substituents possessed by $Ar^1$–$Ar^4$ may form a ring.

4. The organic electroluminescence device as claimed in claim 1, wherein said luminescent layer comprises a mixture of said compound of said first formula and an aromatic triamine compound represented by a fourth formula:

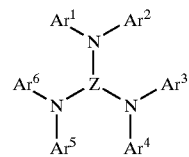

wherein each of $Ar^1$–$Ar^6$ independently represents substituted or unsubstituted aromatic hydrocarbon group, or substituted or unsubstituted aromatic complex ring group, and "Z" represents trivalent substituted or unsubstituted aromatic hydrocarbon group or substituted or unsubstituted aromatic complex ring group, any two of substituents possessed by $Ar^1$–$Ar^6$ may form a ring.

5. The organic electroluminescence device as claimed in claim 1, wherein said luminescent layer comprises said compound of said first formula and an oxime metal complex compound represented by a fifth formula:

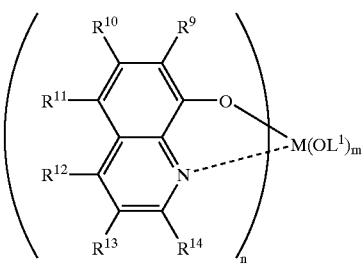

wherein each of $R^9$–$R^{14}$ independently represents hydrogen atom, halogen atom, hydroxy group, substituted or unsubstituted amino group, nitro group, cyano group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic complex ring group, substituted or unsubstituted aralkyl group, substituted or unsubstituted aryloxy group, substituted or unsubstituted alkoxy carbonyl group, or carboxyl group, any two of substituents possessed by $R^9$–$R^{14}$ may form a ring, and "$L^2$" represents substituted or unsubstituted alkyl group, substituted or unsubstituted alkenyl group, substituted or unsubstituted cycloalkyl group, substituted or unsubstituted aromatic hydrocarbon group, substituted or unsubstituted aromatic complex ring group, or substituted or unsubstituted aralkyl group, and "n" is an integer in the range of 1–3, and "m" is an integer in the range of 0–2, and "M" represents a metal ion of (n+m)-valent.

6. The organic electroluminescence device as claimed in claim 1, wherein said luminescent layer comprises said compound of said first formula and an oxime metal complex compound represented by a sixth formula:

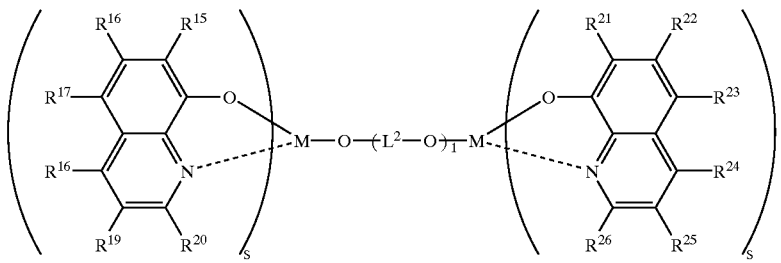

wherein each of $R^{15}$–$R^{26}$ independently represents hydrogen atom, halogen atom, hydroxy group, substituted or unsubstituted amino group, nitro group, cyano group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic complex ring group, substituted or unsubstituted aralkyl group, substituted or unsubstituted aryloxy group, substituted or unsubstituted alkoxy carbonyl group, or carboxyl group, any two of substituents possessed by $R^{15}$–$R^{26}$ may form a ring, and "$L^2$" represents substituted or unsubstituted alkylene group, substituted or unsubstituted alkenylene group, substituted or unsubstituted cycloalkylene group, substituted or unsubstituted arylene group, or substituted or unsubstituted aralkylene group, and "1" is 0 or 1, and "s" is 1 or 2, and "M" represents a metal ion of (s+1)-valent.

7. The organic electroluminescence device as claimed in claim 1, further comprising a substrate, said anode connected to said substrate, said luminescent layer connected to said anode and said cathode connected to said luminescent layer.

8. The organic electroluminescence device as claimed in claim 1, further comprising an electron transfer layer, a hole transfer layer and a substrate, said anode, said hole transfer layer, said luminescent layer, said electron transfer layer, and said cathode, are sequentially connected to each other, in that order, on said substrate.

9. The organic electroluminescence device as claimed in claim 1, further comprising a substrate and an electron transfer layer, said anode, said luminescent layer, said electron transfer layer, and said cathode are sequentially connected to each other, in that order, on said substrate.

10. The organic electroluminescence device as claimed in claim 1, further comprising a hole transfer layer and a substrate, said anode, said hole transfer layer, said luminescent layer and said cathode are sequentially connected to each other, in that order, on said substrate.

* * * * *